US012750038B2

(12) United States Patent
Liu et al.

(10) Patent No.: US 12,750,038 B2
(45) Date of Patent: Sep. 29, 2026

(54) PHASE-SHIFTING CIRCUITS AND RADIO FREQUENCY MICROWAVE SYSTEMS

(71) Applicant: ETRA SEMICONDUCTOR (SUZHOU) CO., LTD., Jiangsu (CN)

(72) Inventors: Xinyu Liu, Suzhou (CN); Xiaowei Zhu, Suzhou (CN); Jun Chen, Suzhou (CN); Jiahui Gao, Suzhou (CN)

(73) Assignee: ETRA SEMICONDUCTOR (SUZHOU) CO., LTD., Suzhou (CN)

( * ) Notice: Subject to any disclaimer, the term of this patent is extended or adjusted under 35 U.S.C. 154(b) by 0 days.

(21) Appl. No.: 19/177,627

(22) Filed: Apr. 13, 2025

(65) Prior Publication Data

US 2026/0066879 A1 Mar. 5, 2026

Related U.S. Application Data

(63) Continuation of application No. PCT/CN2024/138355, filed on Dec. 11, 2024.

(30) Foreign Application Priority Data

Aug. 27, 2024 (CN) ........................ 202411184709.1

(51) Int. Cl.
*H03H 11/16* (2006.01)
*H03H 11/24* (2006.01)
*H03H 11/28* (2006.01)

(52) U.S. Cl.
CPC ............. *H03H 11/16* (2013.01); *H03H 11/24* (2013.01); *H03H 11/28* (2013.01)

(58) Field of Classification Search
CPC ........ H03H 11/16; H03H 11/24; H03H 11/28; H03H 11/20
See application file for complete search history.

(56) References Cited

U.S. PATENT DOCUMENTS

2017/0237475 A1 8/2017 Soga
2018/0131338 A1 5/2018 Shimura
(Continued)

FOREIGN PATENT DOCUMENTS

CN 116846381 A * 8/2023
CN 219554938 U 8/2023
(Continued)

OTHER PUBLICATIONS

Navid Hosseinzadeh et al., A Compact, 37% Fractional Bandwidth Millimeter-wave Phase Shifter Using a Wideband Lange Coupler for 60-GHz and E-band Systems, 2017 IEEE Compound Semiconductor Integrated Circuit Symposium (CSICS), 2017, 4 pages.

*Primary Examiner* — Adam D Houston
(74) *Attorney, Agent, or Firm* — PORUS IP LLC

(57) ABSTRACT

A phase-shifting circuit and a radio frequency microwave system are provided. The phase-shifting circuit includes a first node circuit, a second node circuit, and a first signal channel and a second signal channel coupled between the first node circuit and the second node circuit. The first node circuit is configured to split an input signal to simultaneously output a first differential signal to the first signal channel, and output a second differential signal to the second signal channel. The first signal channel and the second signal channel are implemented based on an architecture of a differential circuit, and configured to perform at least one of a signal attenuation and a quadrant transformation on the first differential signal and the second differential signal for phase-shifting. The second node circuit is configured to synthesize a first phase shift signal output by the first signal channel and a second phase shift signal output by the second signal channel to obtain an output signal, and a phase difference between the output signal and the input signal is within a range of 0 deg-360 deg.

10 Claims, 18 Drawing Sheets

100

(56) References Cited

U.S. PATENT DOCUMENTS

| | | | | |
|---|---|---|---|---|
| 2020/0136581 | A1 | 4/2020 | Tanaka et al. | |
| 2020/0144993 | A1 | 5/2020 | Saha | |
| 2024/0267032 | A1 * | 8/2024 | Peng | H03F 3/19 |
| 2026/0066879 | A1 * | 3/2026 | Liu | H03H 11/16 |
| 2026/0149418 | A1 * | 5/2026 | Liu | H03F 1/56 |

FOREIGN PATENT DOCUMENTS

| | | | | | |
|---|---|---|---|---|---|
| CN | 117674881 | A | * | 3/2024 | H02M 3/07 |
| CN | 118508921 | A | * | 5/2024 | |
| CN | 118523753 | A | | 8/2024 | |
| CN | 120582588 | A | * | 9/2025 | H03H 11/32 |
| CN | 121125418 | A | * | 12/2025 | |
| CN | 121356526 | A | * | 1/2026 | |
| CN | 121887151 | A | * | 4/2026 | |
| TW | 202610158 | A | * | 3/2026 | |
| TW | 202610226 | A | * | 3/2026 | |
| WO | WO-2026044999 | A1 | * | 3/2026 | H03H 11/24 |

* cited by examiner

300

1800

PHASE-SHIFTING CIRCUITS AND RADIO FREQUENCY MICROWAVE SYSTEMS

CROSS-REFERENCE TO RELATED APPLICATION

This application is a continuation application of International Application No. PCT/CN2024/138355, filed on Dec. 11, 2024, which claims priority of Chinese Patent Application No. 202411184709.1, filed on Aug. 27, 2024, the contents of each of which are entirely incorporated herein by reference.

TECHNICAL FIELD

The present disclosure relates to the field of wireless communication, and in particular, to a high-precision and ultra-wideband phase-shifting circuit, and a radio frequency microwave system with the phase-shifting circuit.

BACKGROUND

Modern communication systems (e.g., 5G multiple input multiple output (MIMO) communications, low earth orbit (LEO) satellite communications, etc.) has a high requirement for a numerical control phase shifter. The numerical control phase shifter requires a wide bandwidth with a low in-band insertion loss, a high shift precision, and a small size. The implementations of existing numerical control phase shifter cannot be simultaneously compatible with the above requirements of the modern communication systems for the numerical control phase shifter.

SUMMARY

The solve the above problems, the present disclosure discloses a phase-shifting circuit and a radio frequency microwave system with the phase-shifting circuit. The phase-shifting circuit has stable characteristics and is capable of realizing device miniaturization.

An aspect of the present disclosure discloses a phase-shifting circuit, and the phase-shifting circuit includes: a first node circuit; a second node circuit; and a first signal channel and a second signal channel coupled between the first node circuit and the second node circuit. The first node circuit is configured to split an input signal to simultaneously output a first differential signal to the first signal channel, and output a second differential signal to the second signal channel. The first signal channel and the second signal channel are implemented based on an architecture of a differential circuit, and the first signal channel and the second signal channel are configured to perform at least one of a signal attenuation and a quadrant transformation on the first differential signal and the second differential signal for phase-shifting, respectively. The second node circuit is configured to synthesize a first phase shift signal output by the first signal channel and a second phase shift signal output by the second signal channel to obtain an output signal, and a phase difference between the output signal and the input signal is within a range of 0 deg-360 deg.

According to some embodiments of the present disclosure, the first node circuit includes: a signal processor, and a first transformer and a second transformer electrically connected to two output ends of the signal processor, respectively. The signal processor is configured to generate a pair of orthogonal signals based on the input signal, and the orthogonal signals are input from the two output ends to the first transformer and the second transformer, respectively. The first transformer and the second transformer are configured to generate the first differential signal and the second differential signal based on the orthogonal signals.

According to some embodiments of the present disclosure, the first signal channel and the second signal channel are connected to the first transformer and the second transformer, respectively. Both of the first signal channel and the second signal channel include a signal attenuation circuit, each attenuation circuit includes a plurality of first differential circuits electrically connected in sequence, and the electrical connection between two adjacent first differential circuits includes a direct connection or a connection through an attenuator unit to realize a phase shift in a range of 0 deg-90 deg by attenuating an amplitude of the first differential signal or the second differential signal.

According to some embodiments of the present disclosure, the plurality of first differential circuits are the same.

According to some embodiments of the present disclosure, at least one of the plurality of first differential circuits selects the electrical connection to an adjacent first differential circuit through connection or disconnection between a positive and negative electrode interface of a first input end and a positive and negative electrode interface of a first output end.

According to some embodiments of the present disclosure, both of the first signal channel and the second signal channel further include a quadrant transformer circuit electrically connected to the signal attenuation circuit. The quadrant transformation circuit includes a second differential circuit for realizing the quadrant transformation through connection or disconnection between a positive and negative electrode interface of a second input end and a positive and negative electrode interface of a second output end to change an initial phase of at least one of the first differential signal and the second differential signal after the phase shifting.

According to some embodiments of the present disclosure, the second node circuit includes a third differential circuit for realizing a vector synthesis, a third input end of the third differential circuit receives the first phase shift signal and the second phase shift signal, respectively, and a third output end of the third differential circuit outputs a synthesized signal obtained after a signal synthesis.

According to some embodiments of the present disclosure, the third differential circuit includes: an input differential network including a first port and a second port; an input differential unit including an input differential coupling line; an output differential unit including a first coupling line and a second coupling line; and an output differential network including a first output differential port and a second output differential port. A positive electrode of an input end of the input differential coupling line is connected to the first port, and a negative electrode of the input end of the input differential coupling line is connected to the second port. A positive electrode of an input end of the first coupling line is connected to a positive electrode of an output end of the input differential coupling line, and a negative electrode of an input end of the second coupling line is connected to a negative electrode of the output end of the input differential coupling line. A negative electrode of the input end of the first coupling line is connected to a positive electrode of the input end of the second coupling line. A positive electrode interface of the first output differential port is connected to a positive electrode of an output end of the first coupling line, and a negative electrode interface of the first output differential port is connected to a negative electrode of an output end of the second coupling line. A positive electrode interface of the second output differential port is connected to a negative electrode of the output end of the second coupling line, and a negative electrode interface of the second output differential port is connected to a negative electrode of the output end of the first coupling line. The first output differential port and the second output differential port of the output differential network are configured to receive the first phase shift signal and the second phase shift signal, respectively, and the input differential network is configured to output the synthesized signal.

According to some embodiments of the present disclosure, the synthesized signal is a pair of differential signals designated as the output signal; or the second node circuit further includes a third transformer. The third transformer is electrically connected to the third output end of the third differential circuit, and the third transformer is configured to transform the pair of differential signals to a single-ended signal as the output signal.

Another aspect of the present disclosure provides a radio frequency microwave system, and the radio frequency microwave system includes the phase-shifting circuit as described above.

Additional aspects and advantages of the present disclosure are partially provided in the following description, some of which becomes apparent from the following description, or learned through the practice of the present disclosure.

BRIEF DESCRIPTION OF THE DRAWINGS

The present disclosure is further illustrated in terms of exemplary embodiments. These exemplary embodiments are described in detail with reference to the drawings. These embodiments are not restrictive, and in these embodiments, the same number represents the same structure, wherein.

DETAILED DESCRIPTION

Figure 1:
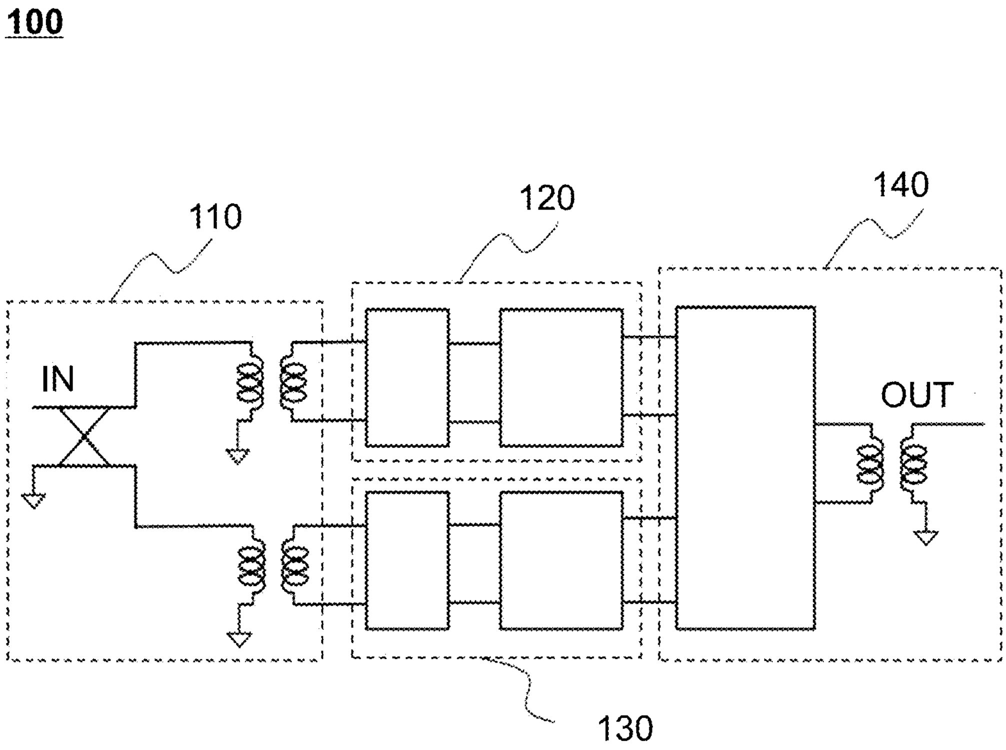
FIG. 1 is an exemplary structural diagram illustrating a phase-shifting circuit according to some embodiments of the present disclosure.

To make the above objects, features, and advantages of the present disclosure more apparent and understandable, the following description describes the specific embodiments of the present disclosure in detail. Many specific details are set forth in the following description to facilitate a full understanding of the present disclosure. However, the present disclosure may be practiced in many other ways than those described herein, and those skilled in the art may make similar improvements without violating the content of the present disclosure, and thus the present disclosure is not limited by the specific embodiments disclosed below.

Unless otherwise defined, all technical and scientific terms used in the present disclosure have the same meanings as are commonly understood by those skilled in the art. Terms used in the present disclosure are used only for the purpose of describing specific embodiments and are not intended to be limiting of the present disclosure. The terms "including" or "comprising," etc., used in the present disclosure means that the component or object preceded by the word encompasses the component or object enumerated after the word and its equivalents, and does not exclude other components or objects. The term "and/or" used in the present disclosure includes any and all combinations of one or more related listed items.

The terms "first," "second," etc., used in the present disclosure are used to distinguish similar objects, which are not intended to describe or indicate a particular order or sequence, and are not to be construed as indicative of or suggestive of relative importance, or as implicitly specifying the number of technical features indicated. Thereby, the features defined as "first" and "second" may expressly or impliedly include one or more of the technical features. In the description of the present disclosure, unless otherwise indicated, "more than one," "a plurality of," "multiple," etc., means two or more. In addition, unless otherwise expressly provided and qualified, the terms "connected," "connection," etc., are to be understood broadly, such as a direct connection, an indirect connection through an intermediate medium, an internal connection of two elements. For those skilled in the art, the specific meanings of the above terms in the present disclosure may be understood according to the specific circumstances.

Numerical control phase shifters are widely used in wireless communications, and the numerical control phase shifter performs a phase modulation on an emitted signal or a received signal, such as 5G multiple input multiple output (MIMO) communications and low orbit satellite (LOS) communications. A phase shift range of the numerical control phase shifter directly affects a phase modulation precision of the wireless communication signal.

There are approximately two types of implementations of the numerical control phase shifter. First, a phase-shifting unit network with a single-ended switch switching a transmission line is used, however, at high frequencies (frequencies greater than 8 GHz), a performance of this type of numerical control phase shifter deteriorates significantly, mainly because with an increase in frequency (especially in a millimeter wave band), a switch insertion loss is large, an insertion loss of a phase-shifting unit is large, especially under a phase of 180 degrees; second, an inductance is used to achieve the phase-shifting function, this type of numerical control phase shifter is also difficult to be achieve at high-frequency, mainly because with the increase of the frequency (especially in the millimeter wave band), an inductive loss increases, and a parasitic capacitance has a significant impact on the performance thereof.

A phase-shifting circuit of a phase shifter disclosed in the present disclosure is realized through a differential circuit architecture, which achieves device miniaturization and provides stable phase characteristics, stable insertion loss characteristics, and stable return loss characteristics. At the same time, the phase-shifting circuit of the phase shifter disclosed in the present disclosure has a high phase-shifting precision and a wide phase-shifting range.

Some preferred embodiments of the present disclosure are described below. It should be noted that the following description is for illustrative purposes and is not intended to limit the scope of protection of the present disclosure. The steps disclosed in the present disclosure may be performed in an exact sequence, or alternatively, the various steps may be processed in an inverted order or processed simultaneously. Also, other steps may be added to these processes or a step or steps may be removed from these processes.

FIG. 1 is an exemplary structural diagram illustrating a phase-shifting circuit according to some embodiments of the present disclosure.

Some embodiments of the present disclosure disclose a phase-shifting circuit, as shown in FIG. 1, a phase-shifting circuit 100 may include a first node circuit 110, a second node circuit 140, and a first signal channel 120 and a second signal channel 130 coupled between the first node circuit 110 and the second node circuit 140.

The first node circuit 110 is configured to split an input signal to simultaneously output a first differential signal to the first signal channel 120, and output a second differential signal to the second signal channel 130. In some embodiments of the present disclosure, the input signal input to the phase-shifting circuit 100 enters from the first node circuit 110, and is split into a pair of orthogonal signals, e.g., an in-phase signal I (or referred to as an I-path signal) and an orthogonal signal Q (or referred to as a Q-path signal). The I/O signals have the same frequency and a phase difference of 90°. The pair of orthogonal signals (i.e., the I-path signal and the Q-path signal) is processed respectively, to generate a pair of differential signals. For example, the first node circuit 110 generates first differential signals I1+ and I1− based on the I-path signal, and generates second differential signals Q1+ and Q1− based on the Q-path signal. The processed orthogonal signals may be output to the first signal channel 120 and the second signal channel 130 simultaneously, to perform at least one of a signal attenuation and a quadrant transformation. For example, the processed I-path signal (e.g., the first differential signals) may be input to the first signal channel 120 for processing, and the processed Q-path signal (e.g., the second differential signals) may be input to the second signal channel 130 for processing. More illustration of the first node circuit 110 may be found in FIG. 2 and the related description.

The first signal channel 120 and the second signal channel 130 may be implemented in an architecture based on a differential circuit. The first signal channel 120 and the second signal channel 130 are configured to perform at least one of a signal attenuation and a quadrant transformation on the first differential signal and the second differential signal, respectively, for phase shifting. In some embodiments, an exemplary circuit structure of the differential circuit may provide a switching core connected between each of the positive and negative electrode interfaces of an input port and an output port. The switching core refers to a semiconductor device used to control an on-off of a radio frequency (RF) signal. In a front-end module of the RF, the switching core is mainly used to switch between different frequency bands or different communication modes to achieve multi-band and multi-mode communication functions. The common switching core is usually composed of PIN diode, GaAs FET (gallium arsenide field effect transistor), etc. The circuit structure reduces an insertion loss, enhances an immunity to interference, and the switching core allows for a high performance with a small device size. That is, by applying a device utilizing the first signal channel 120 and the second signal channel 130 constructed using the differential circuit, a high isolation degree of the device is achieved, while at the same time the size of the device and the insertion loss are reduced. In some embodiments of the present disclosure, the first signal channel 120 and the second signal channel 130 perform at least one of the signal attenuation and the quadrant transformation on a pair of input differential signals to achieve a phase shifting of the input signal. For example, the pair of the first differential signals (e.g., the first differential signals I1+ and I1−) is input to the first signal channel 120 for processing, and the pair of the second differential signals (e.g., the second differential signals Q1+ and Q1−) is input to the second signal channel 130 for processing. The first signal channel 120 and the second signal channel 130 may include a signal attenuation circuit and/or a quadrant transformation circuit, respectively. Exemplarily, the signal attenuation circuit is realized by an attenuator unit In combination with a differential circuit. An amplitude control is realized through an attenuation value of the attenuator unit, and thus a phase shifting control is realized. An ultra-wideband of the phase shifting is realized through characteristics of a high bandwidth and a high isolation of the differential circuit. The quadrant transformation circuit realizes a quadrant change through connection or disconnection of a positive and negative electrode interface between an input end and an output end of the differential circuit, for example, one selected quadrant of four quadrants including a first quadrant (0 deg-90 deg), a second quadrant (90 deg-180 deg), a third quadrant (180 deg-270 deg), and a fourth quadrant (270 deg-360 deg). The phase shifting realized by the signal attenuation circuit combined with an initial phase obtained by the quadrant selection of the quadrant transformation circuit realizes a phase shifting of 0 deg-360 deg. More illustration of the signal attenuation circuit and the quadrant transformation circuit may be found in FIGS. 3-12 and the related description.

The second node circuit 140 is configured to synthesize a first phase shift signal output by the first signal channel 120 and a second phase shift signal output by the second signal channel 130 to obtain an output signal. A phase difference between the output signal and the input signal is in a range of 0 deg-360 deg. In some embodiments of the present disclosure, the second node circuit 140 is used to perform a vector synthesis on the first phase shift signal output by the first signal channel 120 and the second phase shift signal output by the second signal channel 130 to obtain the output signal. The output signal output by the second node circuit 140 may be a pair of differential signals or a single-ended signal. For example, the differential signal is transformed to the single-ended signal and output through the device. In some embodiments, the second node circuit 140 may be constructed using a differential coupling. The insertion loss is reduced, and the isolation degree is improved through a design of an electrical length of a coupling line and an improvement of a connection manner of the input end and the output end. More illustration of the second node circuit 140 may be found in FIGS. 13, 14 and the related description.

The following is an exemplary illustration of various components of the phase-shifting circuit 100. It should be noted that the following description is not limiting.

Figure 2:
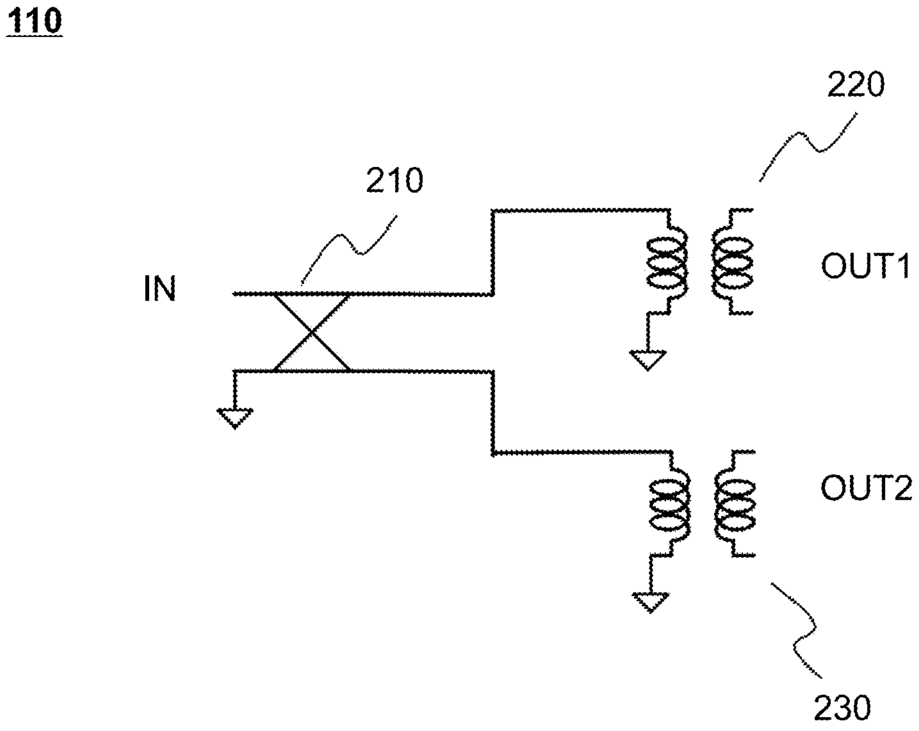
FIG. 2 is an exemplary structural diagram illustrating a first node circuit according to some embodiments of the present disclosure.

FIG. 2 is an exemplary structural diagram illustrating a first node circuit according to some embodiments of the present disclosure.

The first node circuit 110 provided in the present disclosure as shown in FIG. 2 may include a signal processor 210, and a first transformer 220 and a second transformer 230 electrically connected to two output ends of the signal processor 210, respectively. The signal processor 210 is used to generate a pair of orthogonal signals based on the input signal and input the pair of orthogonal signals from two output ends to the first transformer 220 and to the second transformer 230, respectively. The first transformer 220 and the second transformer 230 are used to generate a first differential signal and a second differential signal based on the input orthogonal signals. In some embodiments of the present disclosure, the signal processor 210 is any electronic component capable of implementing a signal splitting function of 90° phase difference, such as a hybrid coupler, a quadrature coupler, a 90° bridge, etc. Taking the signal processor 210 being a 90° bridge as an example, the signal processor 210 includes a single-ended input port IN and two output ports. A port impedance of the single-ended input port may be 50 ohm. The input signal enters from the single-ended input port IN and is processed to output a pair of orthogonal signals, i.e., the I-path signal and the Q-path signal. The pair of orthogonal signals are output from the two output ports to the first transformer 220 and the second transformer 230, respectively. The first transformer 220 and the second transformer 230 may utilize coil inductive characteristics (e.g., coil mid-segment lead-out) to transform the orthogonal signals to the differential signals, and output the differential signals from output ends OUT1 and OUT2. Exemplarily, the first transformer 220 is used to process the I-path signal to output first differential signals I1+ and I1− from the output end OUT1. The second transformer 230 is used to process the Q-path signals to output second differential signals Q1+ and Q1− from the output end OUT2.

Figure 3:
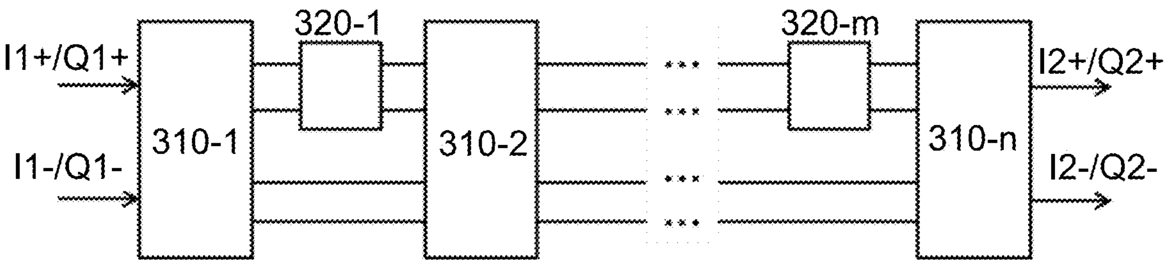
FIG. 3 is an exemplary structural diagram illustrating a signal attenuation circuit according to some embodiments of the present disclosure.

FIG. 3 is an exemplary structural diagram illustrating a signal attenuation circuit according to some embodiments of the present disclosure.

The first signal channel 120 and the second signal channel 130 are connected to the first transformer 220 and the second transformer 230, respectively. A signal attenuation circuit 300 provided in the present disclosure shown in FIG. 3 may be a component of the first signal channel 120 and the second signal channel 130. For example, a circuit structure of the signal attenuation circuit 300 is the same in both of the first signal channel 120 and the second signal channel 130. As shown in FIG. 3, the signal attenuation circuit 300 may include a plurality of first differential circuits 310-1, 310-2, . . . , and **310-*n* electrically connected in sequence. A manner of electrical connection between two adjacent first differential circuits includes a direct connection or a connection through an attenuator unit to realize a phase shift in a range of 0 deg-90 deg by attenuating an amplitude of the first differential signal or the second differential signal. In some embodiments of the present disclosure, the differential signals (e.g., the first differential signals I1+ and I1−, the second differential signals Q1+ and Q1−) output by the first transformer 220 and the second transformer 230 are input from a first differential input end of the first differential circuit 310-1. The first differential input end includes a positive electrode interface and a negative electrode interface. For example, I1+ or Q1+ are input from the positive electrode interface, and I1− or Q1− are input from the negative electrode interface. Subsequently, the differential signal may transmit between two adjacent first differential circuits directly or through the attenuator unit (e.g., attenuator units 320-1, . . . , 320-*m*). And the differential signals transmitted through the attenuator units achieve an amplitude attenuation, which triggers a phase shifting. The attenuator unit may include a digital attenuator, a waveguide attenuator, a PIN diode attenuator, etc. More illustration of the signal attenuation circuit and the first differential circuit may be found in FIGS. 4-6** and the related description.

In some embodiments of the present disclosure, the circuit structures of the plurality of first differential circuits may be the same or different. At least one of the plurality of first differential circuits may include a first input end and a first output end. The first input end may include one or more input ports, and the first output end may include a plurality of output ports. An input port and/or an output port may include a positive electrode interface OUT+ and a negative electrode interface IN−. At least one of the plurality of first differential circuits selects the electrical connection to an adjacent first differential circuit through connection or disconnection between the positive and negative electrode interface of the first input end and the positive and negative electrode interface of the first output end. The electrical connection may include the direct connection and the connection through the attenuator unit.

Figure 4:
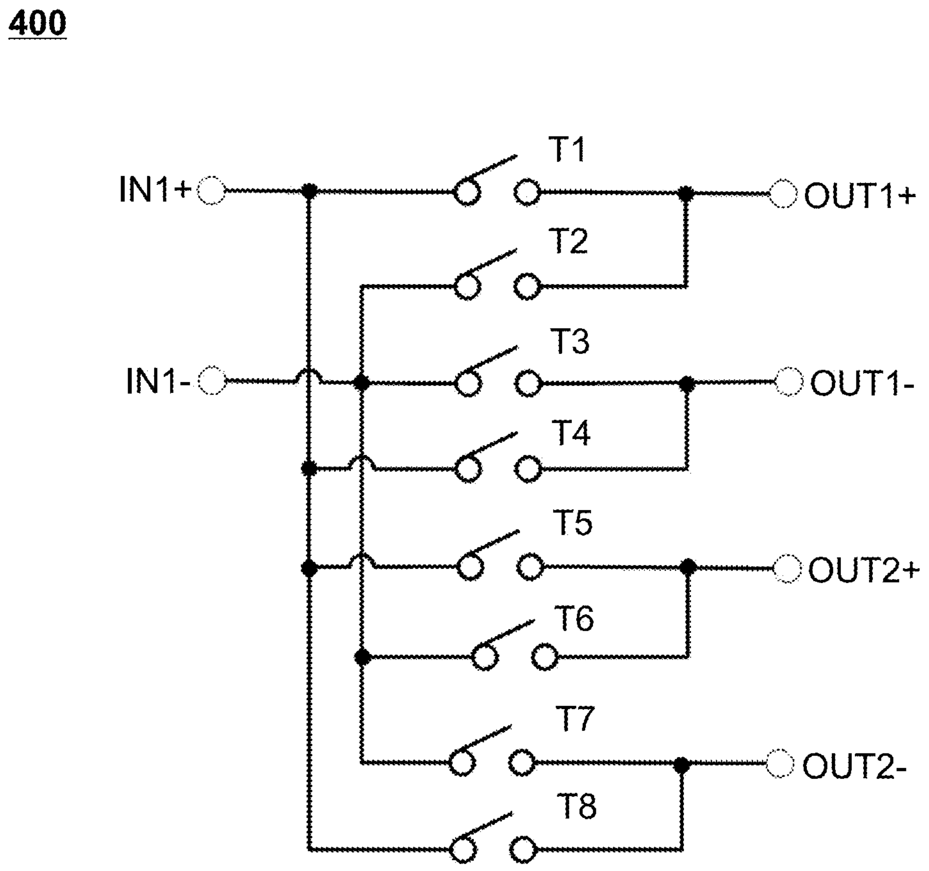
FIG. 4 is an exemplary structural diagram illustrating a differential circuit according to some embodiments of the present disclosure.

FIG. 4 is an exemplary structural diagram illustrating a differential circuit according to some embodiments of the present disclosure.

As shown in FIG. 4, the present disclosure provides a first differential circuit 400. A first input end of the first differential circuit 400 includes a positive electrode interface IN1+ and a negative electrode interface IN1−, and a first output end of the first differential circuit 400 includes two output ports, one output port includes a positive electrode interface OUT1+ and a negative electrode interface OUT1−, and the other one output port includes a positive electrode interface OUT2+ and a negative electrode interface OUT2−. A switching core is connected between the positive and negative electrode interfaces of the first input end and the positive and negative electrode interfaces of the first output end, respectively, which includes a first switching core T1, a second switching core T2, a third switching core T3, a fourth switching core T4, a fifth switching core T5, a sixth switching core T6, a seventh switching core T7, and an eighth switching core T8. The input ends of the first switching core T1, the fourth switching core T4, the fifth switching core T5, and the eighth switching core T8 are coupled and are jointly connected to the interface IN1+. The input ends of the second switching core T2 the third switching core T3, the sixth switching core T6, and the seventh switching core T7 are coupled and are jointly connected to the interface IN1−. The output ends of the first switching core T1 and the second switching core T2 are coupled and jointly connected to the interface OUT1+. The output ends of the third switching core T3 and the fourth switching core T4 are coupled and jointly connected to the interface OUT1−. The output ends of the fifth switching core T5 and the sixth switching core T6 are coupled and jointly connected to the interface OUT2+. The output ends of the seventh switching core T7 and the eighth switching core T8 are coupled and jointly connected to the interface OUT2−.

In the first differential circuit 400, the connection or disconnection between the positive and negative electrode interfaces of the first input end and the first output end may be realized by disposing a power supply voltage of each switching core, so as to select whether the manner of the electrical connection between the adjacent differential circuits is the direct connection or the connection through the attenuator unit. Exemplarily, a supply voltage of the first switching core T1 and the third switching core T3 is selected to be V1, then a supply voltage of the second switching core T2, the fourth switching core T4, the fifth switching core T5, the sixth switching core T6, the seventh switching core T7, and the eighth switching core T8 is −V1; then, when V1 is a positive voltage (V1>Vth, and Vth is a gate threshold voltage), the interface IN1+ is connected to the interface OUT1+, the interface IN1− is connected to the interface OUT1−, the interface IN1+ is disconnected to the interface OUT2+, and the interface IN1− is disconnected to the interface OUT2−. The supply voltage of the fifth switching core T5 and the seventh switching core T7 is selected to be V1, then the supply voltage of the first switching core T1, the second switching core T2, the third switching core T3, the fourth switching core T4, the sixth switching core T6, and the eighth switching core T8 is −V1; then, when V1 is the positive voltage (V1>Vth), the interface IN1+ is connected to the interface OUT2+, the interface IN1− is connected to the interface OUT2−, the interface IN1+ is disconnected to the interface OUT1+, and the interface IN1− is disconnected to the interface OUT1−.

Accordingly, when the differential signals are input from the interfaces IN1+ and IN1−, respectively, the signal may be made to be output from the interfaces OUT1+ and OUT1−, or the interfaces OUT2+ and OUT2−, by disposing the supply voltage of the switching core. Exemplarily, the first differential circuit 400 is the first differential circuit 310-1 of the signal attenuation circuit 300. The interfaces OUT1+ and OUT1− are followed and connected by the attenuator unit 320-1, the interfaces OUT2+ and OUT2− are followed and connected by the second first differential circuit 320-2, then the foregoing voltage provided for the switching core makes the differential signals to be output from the interfaces OUT1+ and OUT1− and pass through the attenuator unit 320-1, such that a manner of electrical connection between the first differential circuit 310-1 and the adjacent second first differential circuit 310-2 is the connection through the attenuator unit, or the foregoing voltage provided for the switching core makes the differential signals to be output from the interfaces OUT2+ and OUT2− and directly input into the next first differential circuit, such that the electrical connection between the first differential circuit 310-1 and the adjacent second first differential circuit 310-2 is the direct connection.

In some embodiments of the present disclosure, the first differential circuit 400 may also adjust an insertion loss and an isolation degree by adjusting a size of the switching core and a resistance of each electrode. The adjustment the size of the switching core may refer to adjusting an on-resistance ($R_{on}$) value (that is, an on-resistance of the switching core) of the switching core in a connected state. The insertion loss of the switching core is jointly determined by the $R_{on}$ value and a drain-to-source resistance ($R_{ds}$) after the switching core is connected, that is, $R_{on}$ is connected in parallel to $R_{ds}$. A gate to source resistance ($R_{gs}$) affects a voltage of the switching core, that is, the insertion loss of the switch varies for different voltages. Therefore, the insertion loss and the device size may be balanced by adjusting a size of the switching core and the resistance of each electrode, and at the same time, the smaller a switching disconnection capacitance and the smaller the size are, the better the isolation degree is, and the isolation degree of the differential circuit (e.g., the first differential circuit) may be adjusted by adjusting the size of the switching core. Thus, the first differential circuit 400 may be set to have a high isolation degree as well as a low insertion loss, which allows the device to balance advantages of the small size, the high isolation degree, and the low insertion loss, which results in a higher precision of the phase shifting.

In some embodiments of the present disclosure, the first differential circuit 400 is also connected to a matching circuit to reduce a return loss. Exemplarily, the matching circuit includes an input matching circuit and an output matching circuit, which are connected to the first input end and the first output end by matching through a coupling line, respectively. The return loss of the first input end and the first output end may be adjusted by adjusting one or more of an even mode impedance, an odd mode impedance, or an electrical length of the coupling line. The adjustment of the even mode impedance and the odd mode impedance essentially adjusts the differential impedance of the port, and a port impedance affects the return loss, so that an effect of adjusting the return loss may be achieved. In a radio frequency and a microwave frequency, different electrical lengths show different impedances, and by changing the electrical length, the port impedance may be adjusted.

Figure 5:
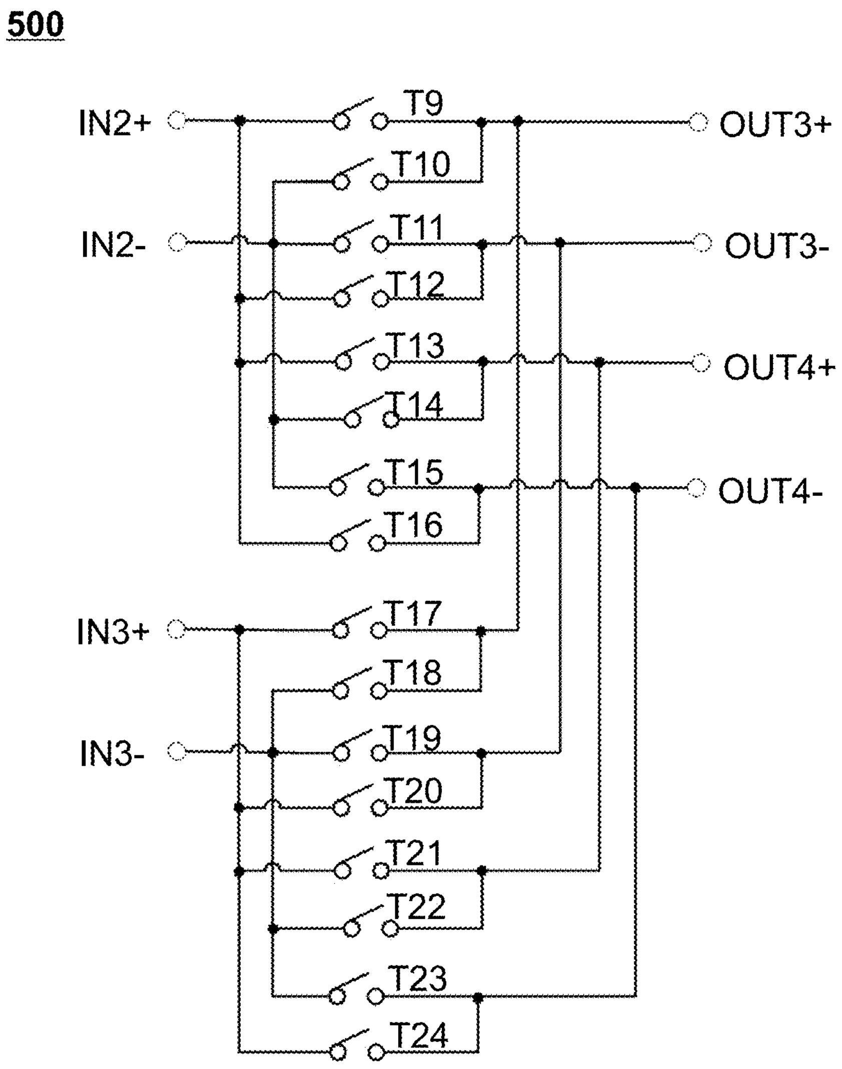
FIG. 5 is an exemplary structural diagram illustrating another differential circuit according to some embodiments of the present disclosure.

FIG. 5 is an exemplary structural diagram illustrating another differential circuit according to some embodiments of the present disclosure.

Referring to FIG. 5, another first differential circuit 500 is provided in the present disclosure. A first input end of the first differential circuit 500 may include two input ports. One input port includes a positive electrode interface IN2+ and a negative electrode interface IN2−, and the other input port includes a positive electrode interface IN3+ and a negative electrode interface IN3−. A first output end may include two output ports. One output port includes a positive electrode interface OUT3+ and a negative electrode interface OUT3−, and the other output port includes a positive electrode interface OUT4+ and a negative electrode interface OUT4−.

A switching core is connected between the positive and negative electrode interfaces of the first input end and the positive and negative electrode interfaces of the first output end, respectively. The switching core includes a ninth switching core T9, a tenth switching core T10, an eleventh switching core T11, a twelfth switching core T12, a thirteenth switching core T13, a fourteenth switching core T14, a fifteenth switching core T15, a sixteenth switching core T16, a seventeenth switching core T17, an eighteenth switching core T18, a nineteenth switching core T19, a twentieth switching core T20, a twenty-first switching core T21, a twenty-second switching core T22, a twenty-third switching core T23, and a twenty-fourth switching core T24. Input ends of the ninth switching core T9, the twelfth switching core T12, the thirteenth switching core T13, and the sixteenth switching core T16 are coupled and are jointly connected to the interface IN2+. Input ends of the tenth switching core T10, the eleventh switching core T11, the fourteenth switching core T14, and the fifteenth switching core T15 are coupled and jointly connected to the interface IN2−. Input ends of the seventeenth switching core T17, the twentieth switching core T20, the twenty-first switching core T21, and the twenty-fourth switching core T24 are coupled and jointly connected to the interface IN3+. Input ends of the eighteenth switching core T18, the nineteenth switching core T19, the twenty-second switching core T22, and the twenty-third switching core T23 are coupled and jointly connected to the interface IN3−. Output ends of the ninth switching core T9, the tenth switching core T10, the seventeenth switching core T17, and the eighteenth switching core T18 are coupled and jointly connected to the interface OUT3+. Output ends of the eleventh switching core T11, the twelfth switching core T12, the nineteenth switching core T19, and the twentieth switching core T20 are coupled and connected to the interface OUT3−. Output ends of the thirteenth switching core T13, the fourteenth switching core T14, the twenty-first switching core T21, and the twenty-second switching core T22 are coupled and jointly connected to interface OUT4+. Output ends of the fifteenth switching core T15, the sixteenth switching core T16, the twenty-third switching core T23, and the twenty-fourth switching core T24 are coupled and jointly connected to the interface OUT4−.

In some embodiments of the present disclosure, for the first differential circuit 500, by disposing a supply voltage of each switching core, the connection or disconnection between the positive and negative electrode interfaces of the first input end and the first output end are implemented, so as to select whether the manner of the electrical connection between the adjacent differential circuits is the direct connection or the connection through an attenuator unit. Exemplarily, when the supply voltage of the ninth switching core T9, the eleventh switching core T11, the twenty-first switching core T21, and the twenty-third switching core T23 is selected to be V3, then the supply voltage of the tenth switching core T10, the twelfth switching core T12 to the twentieth switching core T20, the twenty-second switching core T22, and the twenty-fourth switching core T24 is −V3; then, when V3 is a positive voltage (V3>Vth), the interface IN2+ is connected to the interface OUT3+, the interface IN2− is connected to the interface OUT3−, the interface IN3+ is connected to the interface OUT4+, the interface IN3− is connected to the interface OUT4−, the interface IN2+ is disconnected from the interface OUT4+, the interface IN2− is disconnected from the interface OUT4−, the interface IN3+ is disconnected from the interface OUT3+, and the interface IN3− is disconnected from the interface OUT3−. When the supply voltage of the thirteenth switching core T13, the fifteenth switching core T15, the seventeenth switching core T17, and the nineteenth switching core T19 is selected to be V3, then the tenth switching core T10, the eleventh switching core T11, the twelfth switching core T12, the fourteenth switching core T14, the sixteenth switching core T16, the eighteenth switching core T18, the twentieth switching core T20 to the twenty-fourth switching core T24 is −V3; then, when V3 is the positive voltage (V3>Vth), the interface IN2+ is connected to the interface OUT4+, the interface IN2− is connected to the interface OUT4−, the interface IN3+ is connected to the interface OUT3+, the interface IN3− is connected to the interface OUT3−, the interface IN2+ is disconnected from the interface OUT3+, the interface IN2− is disconnected from the interface OUT3−, the interface IN3+ is disconnected from the interface OUT4+, and the interface IN3− is disconnected from the interface OUT4−.

Accordingly, when the differential signals are input from the interfaces IN2+ and IN2−, or IN3+ and IN3−, respectively (e.g., the differential signal is directly input from the previous first differential circuit or after attenuation occurs through an attenuator unit), the signal may be made to be output from the interfaces OUT3+ and OUT3−, or OUT4+ and OUT4−, by disposing the supply voltage for the switching core. Exemplarily, the first differential circuit 500 is a second first differential circuit 310-2 of the signal attenuation circuit 300, the interfaces IN2+ and IN2− are front-connected to the attenuator unit 320-1, and the interfaces IN3+ and IN3− are front-connected to the first differential circuit 310-1 for receiving the input differential signals. The interface receives the differential signal is determined based on the selection of the output of the previous first differential circuit 310-1, and more illustration may be found in the above description. The interfaces OUT3+ and OUT3− are followed and connected by the attenuator unit, and the interfaces OUT4+ and OUT4− are followed and connected by a third first differential circuit, then the afore-mentioned supply voltages provided to the switching cores allow the differential signals to be output from the interfaces OUT3+ and OUT3−, and to pass through the attenuator unit, or output from the interfaces OUT4+ and OUT4− and directly input into the next first differential circuit.

Similarly, the first differential circuit 500 may also adjust the isolation degree and the insertion loss of the circuit by adjusting the size of the included switching cores and the resistance of each electrode. In this way, a high isolation degree as well as a low insertion loss of the first differential circuit 500 may be achieved. The device using the first differential circuit 500 is also able to balance the advantages of small size, high isolation degree, and low insertion loss, which results in a phase shifting with a higher precision.

Alternatively, the first differential circuit 500 also may be connected with a matching circuit to reduce a return loss. Specifically, more illustration may be found in the description with respect to the first differential circuit 400, which is not repeated herein.

Figure 6:
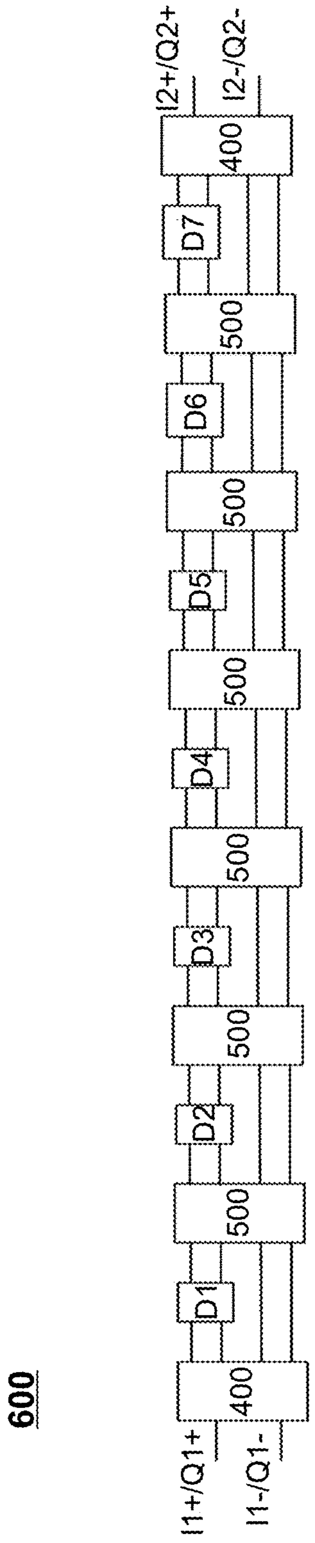
FIG. 6 is an exemplary structural diagram illustrating another signal attenuation circuit according to some embodiments of the present disclosure.

FIG. 6 is an exemplary structural diagram illustrating another signal attenuation circuit according to some embodiments of the present disclosure.

FIG. 6 shows a signal attenuation circuit 600 provided in accordance with some embodiments of the present disclosure, and the signal attenuation circuit 600 may realize a 7-bit step attenuation with an attenuation range of 0-31.75 dB. As shown in FIG. 6, the signal attenuation circuit 600 may include two first differential circuits 400 and six first differential circuits 500. The six first differential circuits 500 are connected sequentially between the two first differential circuits 400. Attenuator units are disposed between two adjacent first differential circuits, and a total of seven attenuator units are provided. Based on a signal transmission direction, an attenuator unit D1 realizes a 16 dB attenuation, an attenuator unit D2 realizes a 8 dB attenuation, an attenuator unit D3 realizes a 4 dB attenuation, an attenuator unit D4 realizes a 2 dB attenuation, an attenuator unit D5 realizes a 1 dB attenuation, an attenuator unit D6 realizes a 0.5 dB attenuation, and an attenuator unit D7 realizes a 0.25 dB attenuation. The first differential signals I1+ and I1− output by the first node circuit 110, or the second differential signals Q1+ and Q1− output by the second node circuit 110, are input from the first differential circuit 400 disposed at the first place, and output by the first differential circuit 400 disposed at the end after being attenuated or through the direct connection, to obtain the amplitude-attenuated differential signals I2+ and I2−, or Q2+ and Q2−. The signal attenuation circuit 600 achieves a phase shifting in a range of 0-90° by performing an amplitude attenuation on the differential signals.

The signal attenuation circuit 300/600 of the present disclosure implements the phase shifting through an amplitude control. An attenuation value of the amplitude may be realized by a plurality of combinations, and the more combinations, the higher a phase shifting precision. At the same time, based on a high bandwidth and a high isolation degree of the first differential circuit, a device using the first differential circuit may achieve an ultra-wideband. Additionally, the low insertion loss of the first differential circuit enables the low insertion loss of the device using the first differential circuits.

Figure 7:
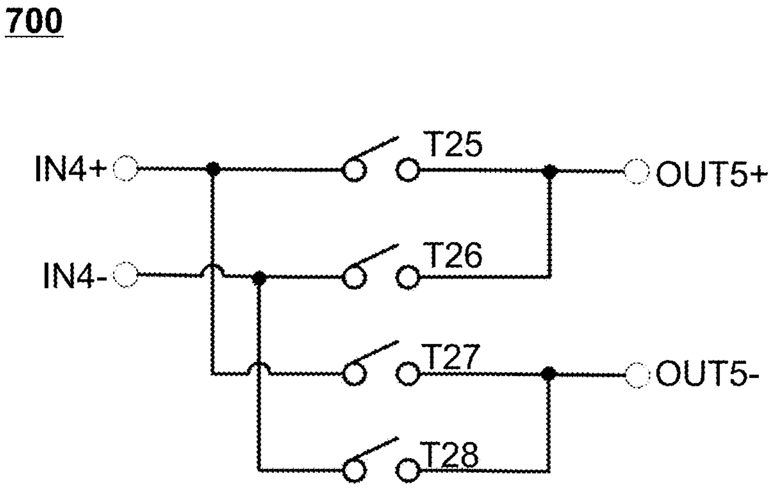
FIG. 7 is an exemplary structural diagram illustrating a quadrant selection circuit according to some embodiments of the present disclosure.
Figure 8:
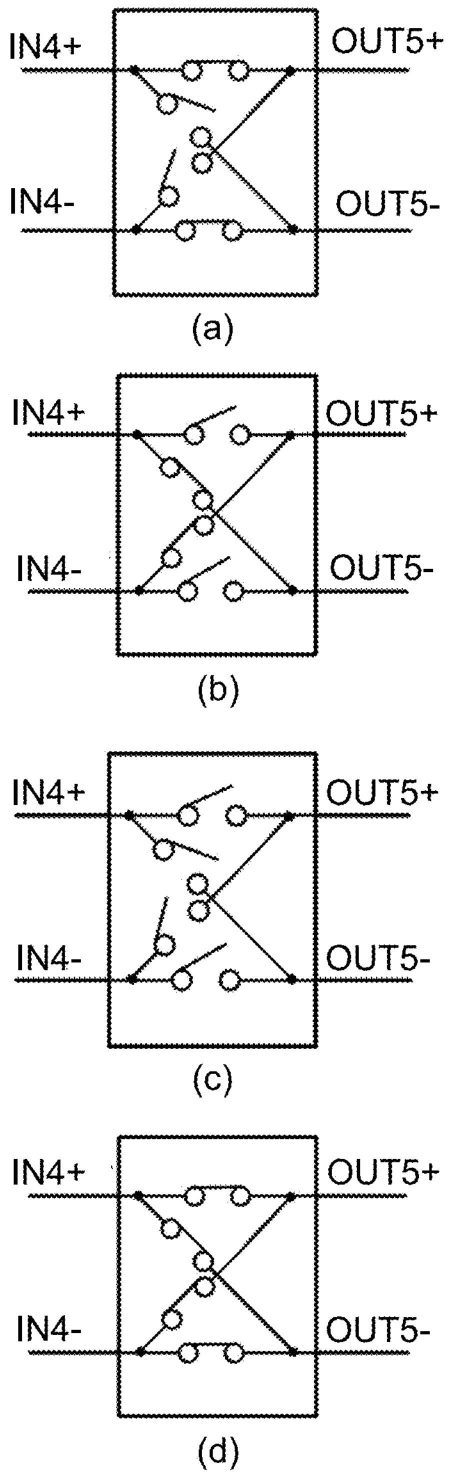
FIG. 8 is an exemplary schematic diagram illustrating a connection state of a differential circuit constituting a quadrant selection circuit according to some embodiments of the present disclosure.
Figure 9:
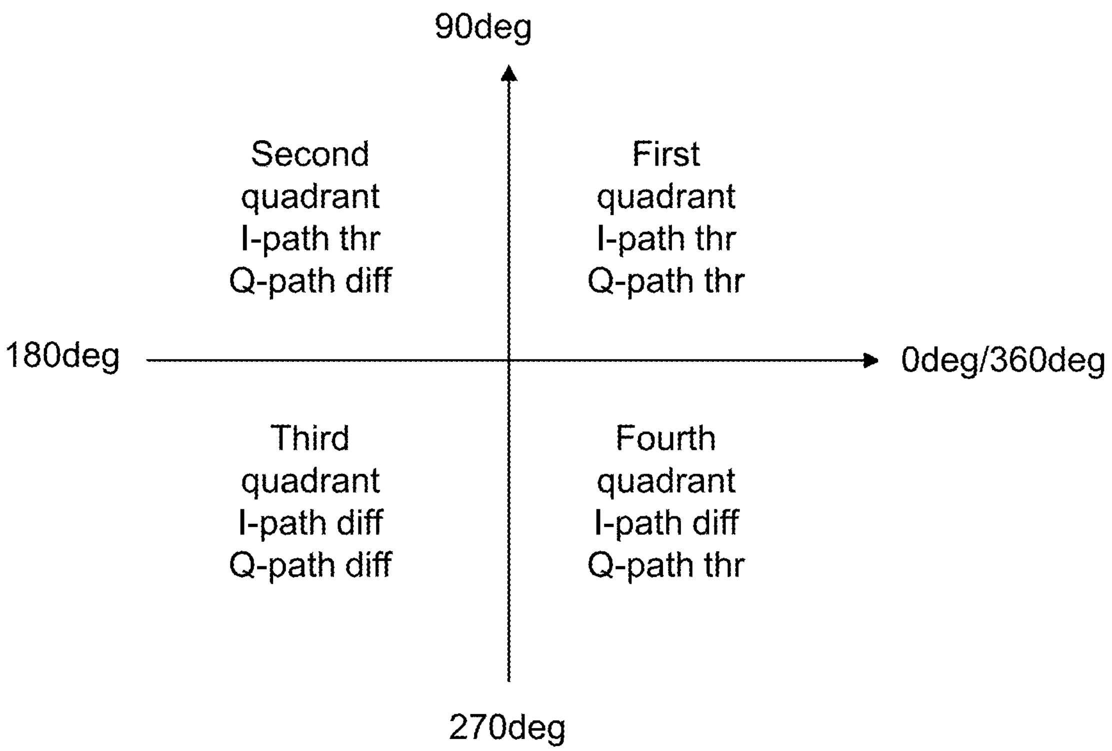
FIG. 9 is an exemplary schematic diagram illustrating characteristics of a connection state of a differential circuit corresponding to a quadrant according to some embodiments of the present disclosure.

FIG. 7 is an exemplary structural diagram illustrating a quadrant selection circuit according to some embodiments of the present disclosure. FIG. 8 is an exemplary schematic diagram illustrating a connection state of a differential circuit constituting a quadrant selection circuit according to some embodiments of the present disclosure. FIG. 9 is an exemplary schematic diagram illustrating characteristics of a connection state of a differential circuit corresponding to a quadrant according to some embodiments of the present disclosure.

In some embodiments of the present disclosure, both the first signal channel 120 and the second signal channel 130 further includes a quadrant transformation circuit electrically connected to the signal attenuation circuit 300/600. The quadrant transformation circuit includes a second differential circuit 700. The quadrant transformation is realized by the second differential circuit 700 through connection or disconnection between a positive and negative electrode interface of a second input end and a positive and negative electrode interface of a second output end to change an initial phase of at least one of the first differential signal and the second differential signal after the phase shifting. The quadrant transformation circuit including the second differential circuit 700 shown in FIG. 7 provided in the present disclosure may be a component of the first signal channel 120 and the second signal channel 130. For example, the circuit structure of the quadrant transformation circuit is the same in both of the first signal channel 120 and the second signal channel 130. The quadrant transformation circuit may be connected to the signal attenuation circuit 300 to form the first signal channel 120 and the second signal channel 130 together with the signal attenuation circuit 300. As shown in FIG. 7, the second differential circuit 700 may include a second input end including a positive electrode interface IN4+ and a negative electrode interface I4−, and a second output end including a positive electrode interface OUT5+ and a negative electrode interface OUT5−. Switching cores are connected between the positive and negative electrode interfaces of the second input end and the positive and negative electrode interfaces of the second output end. The switching core includes a twenty-fifth switching core T25, a twenty-sixth switching core T26, a twenty-seventh switching core T27, and a twenty-eighth switching core T28. The input end of the twenty-fifth switching core T25 and the input end of the twenty-seventh switching core T27 are coupled and jointly connected to the interface IN4+. The input end of the twenty-sixth switching core T26 and the input end of the twenty-eighth switching core T28 are coupled and jointly connected to the interface IN4−. The output end of the twenty-fifth switching core T25 and the output end of the twenty-sixth switching core T26 are coupled and jointly connected to the interface OUT5+. The output end of the twenty-seventh switching core T27 and the output end of the twenty-eighth switching core T28 are coupled and jointly connected to the interface OUT5−.

In some embodiments of the present disclosure, the second differential circuit 700 also realizes an adjustment of isolation degree as well as an insertion loss by adjusting a size of the switching core and a resistance of the each electrode. The second differential circuit 700 further is connected to a matching circuit to reduce a return loss. More illustration may be found in the foregoing related description of the first differential circuit.

In some embodiments of the present disclosure, for the second differential circuit 700, a connection and a disconnection between the positive and negative electrode interfaces of the second input end and the second output end may be realized by disposing a supply voltage of the each switching core to achieve a state change of the second differential circuit 700. A combination of different states of the two second differential circuits 700 (e.g., included in the first signal channel 120 and the second channel signal 130, respectively) used to process the I-path signal and the Q-path signal, respectively, may realize a quadrant transformation to change an initial phase of the phase-shifted first differential signal and the phase-shifted second differential signal that are output after being processed by the signal attenuation circuit 300. Combining the phase shifting in a range of 0-90° achieved by the signal attenuation circuit 300 and an initial phase change achieved by the quadrant transformation circuit, a phase shifting in a range of 0-360° is realized by the phase-shifting circuit 100.

Exemplarily, the second differential circuit 700 have four states, as illustrated in conjunction with FIG. 8. As shown in FIG. 8, the states of the second differential circuit 700 provided by the present disclosure include a straight-through state thr (shown in FIG. 8(*a*)), a differential state diff (shown in FIG. 8(*b*)), an open-circuit state open (shown in FIG. 8(*c*)), and a short-circuit state short (shown in FIG. 8(*d*)). In the straight-through state thr, the interface IN4+ is connected to the interface OUT5+, the interface IN4− is connected to the interface OUT5−, the interface IN4+ is disconnected from the interface OUT5−, and the interface IN4− is disconnected from the interface OUT5+. In the differential state diff, the interface IN4+ is disconnected from the interface OUT5+, the interface IN4− is disconnected from the interface OUT5−, the interface IN4+ is connected to the interface OUT5−, and the interface IN4− is connected to the interface OUT5+. In the open-circuit state open, the interface IN4+ is disconnected from the interface OUT5+, the interface IN4− is disconnected from the interface OUT5−, the interface IN4+ is disconnected from the interface OUT5−, and the interface IN4− is disconnected from the interface OUT5+. In the short-circuit state short, the interface IN4+ is connected to the interface OUT5+, the interface IN4− is connected to the interface OUT5−, the interface IN4+ is connected to the interface OUT5−, and the interface IN4− is connected to the interface OUT5+.

Selection of four quadrants may be achieved by combining the states of the two second differential circuits 700 included in the first signal channel 120 and the second channel signal 130. Exemplarily, when the state of the second differential circuit 700 in the first signal channel 120 for processing the I-path signal is the straight-through state thr, and the state of the second differential circuit in the second signal channel 130 for processing the Q-path signal is the straight-through thr, then the first quadrant Q1(0-90°) is selected. When the state of the second differential circuit 700 in the first signal channel 120 for processing the I-path signal is the straight-through state thr, and the state of the second differential circuit in the second signal channel 130 for processing the Q-path signal is the differential state diff, then the second quadrant Q2 (90°-180°) is selected. When the state of the second differential circuit 700 in the first signal channel 120 for processing the I-path signal is the differential state diff, and the state of the second differential circuit in the second signal channel 130 for processing the Q-path signal is the differential state diff, then the third quadrant Q3 (180°-270°) is selected. When the state of the second differential circuit 700 in the first signal channel 120 for processing the I-path signal is the differential state diff, and the state of the second differential circuit in the second signal channel 130 for processing the Q-path signal is the straight-through state thr, then the fourth quadrant Q4 (270°-360°) is selected. The open-circuit state open may be used to realize a disconnection of a device (e.g., a phase shifter) to which the second differential circuit 700 is applied, and the short-circuit state short may be used to realize a short circuit of the device (e.g., the phase shifter) to which the second differential circuit 700 is applied. The foregoing description may be more clearly understood by referring to FIG. 9, which is an exemplary schematic diagram illustrating characteristics of a connection state of a differential circuit corresponding to a quadrant according to the present disclosure.

Figure 10:
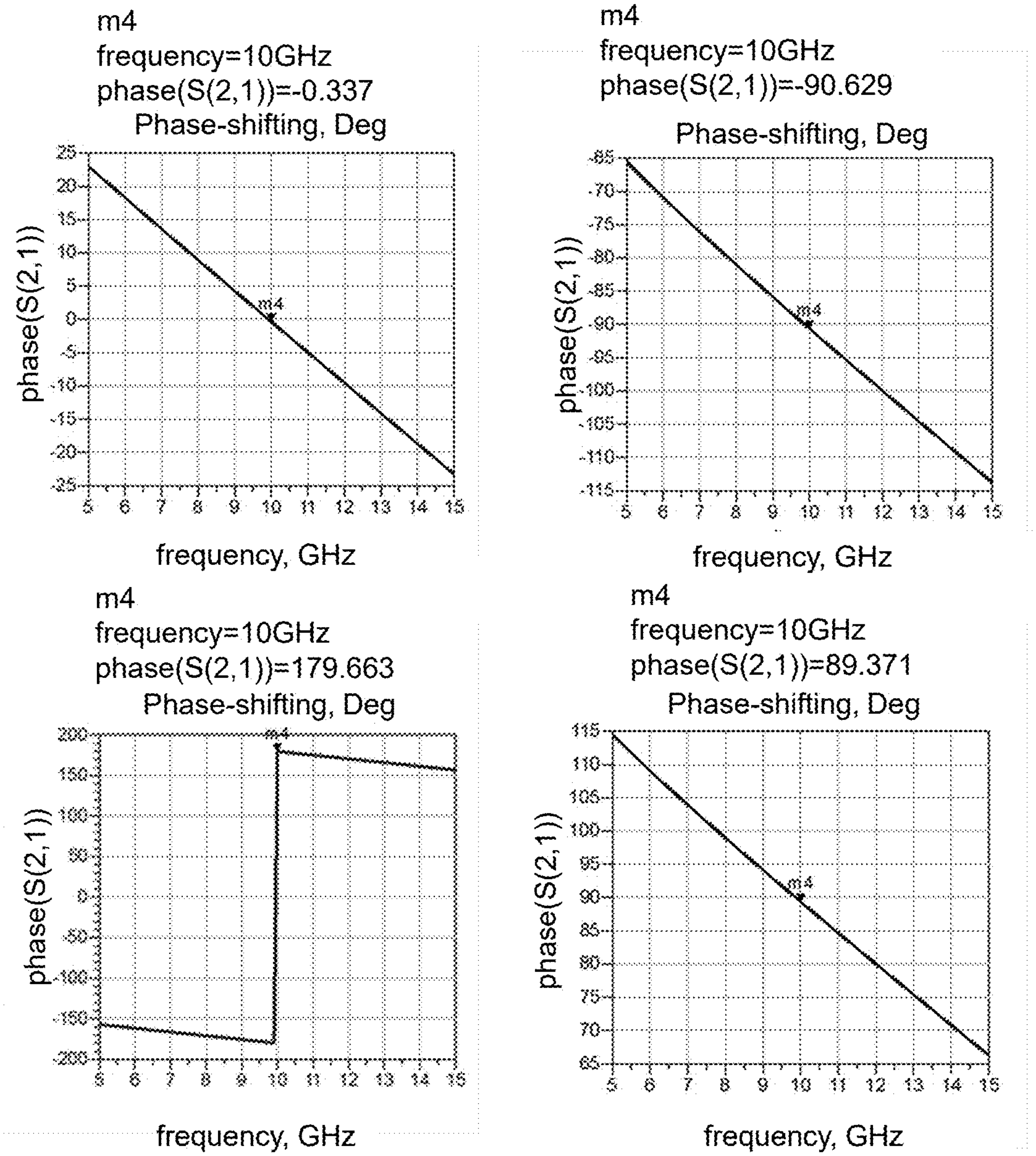
FIG. 10 is an exemplary schematic diagram illustrating an initial phase characteristic of a quadrant according to some embodiments of the present disclosure.

FIG. 10 is an exemplary schematic diagram illustrating an initial phase characteristic of a quadrant according to some embodiments of the present disclosure. Using 10 GHz (a center frequency point) as a reference, initial phases corresponding to four quadrants are −0.3 deg, −90.6 deg, 179.6 deg, and 89.4 deg, respectively. In this way, the switching of the four quadrants may be realized by the combination of the states of the second differential circuit 700 associated with the two-path (I-path/Q-path) signals.

Figure 11:
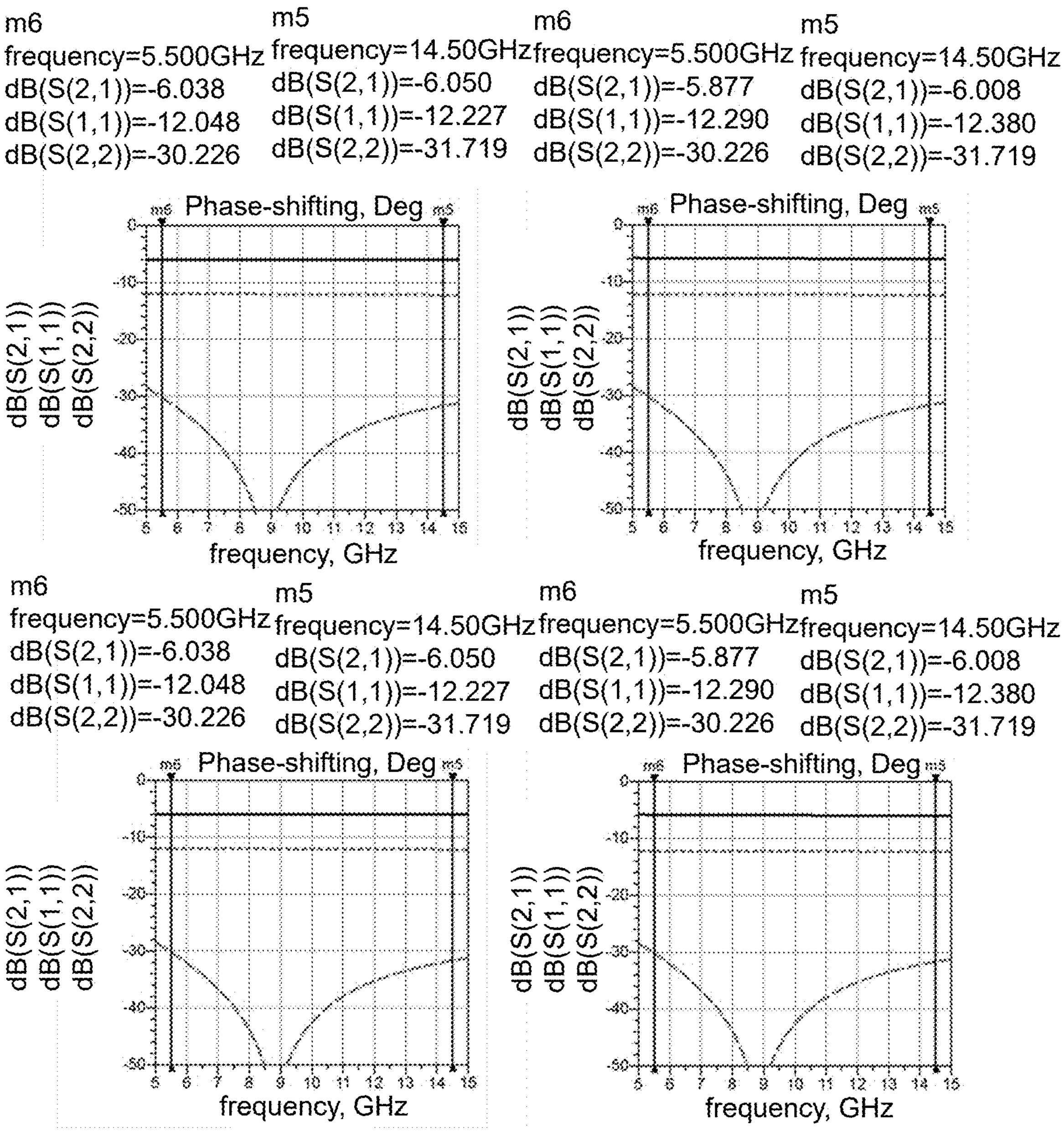
FIG. 11 is an exemplary schematic diagram illustrating an S-parameter of an initial phase of a quadrant according to some embodiments of the present disclosure.

FIG. 11 is an exemplary schematic diagram illustrating an S-parameter of an initial phase of a quadrant according to some embodiments of the present disclosure. The S-parameter refers to a scattering parameter that describes transmission and reflection relationship of a signal between network ports. As shown in FIG. 11, in a frequency range of 5 GHz-15 GHz, the S-parameters corresponding to the initial phases in the four quadrants have a return loss that is less than −12 dB and an insertion loss that is greater than −6.1 dB, and an amplitude balance degree is less than ±0.1 dB in the four kinds of states, which possesses a good consistency and indicates that the insertion loss of the phase-shifting circuit does not deteriorate due to an increase of a shifted phase. That is, an additional attenuation value of the phase-shifting circuit is small (close to 0). An in-band amplitude fluctuation is less than 0.2 dB (a maximum interpolation loss is −5.8 dB, a minimum interpolation loss is −6 dB) over a whole frequency band, indicating that the phase-shifting circuit has a very small parasitic parameter at a high frequency, and is able to work in an ultra-wide frequency band, and a third octave bandwidth may be achieved. The parasitic parameter refers to a parameter that is unintentionally introduced into an electronic component or a circuit and is usually not required by design, which affects a performance of the component or the circuit. The parasitic parameter may include a parasitic capacitance, a parasitic inductance, a parasitic resistance, etc.

In the first signal channel 120 and the second signal channel 130, the interfaces IN4+ and IN4− of a second input end of the second differential circuit 700 constituting a quadrant transformation circuit may be used to receive the differential signal I2+/Q2+ or I2−/Q2− output by the signal attenuator circuit 300/600, while the interfaces OUT5+ and OUT5− of a second output end output a differential signal I3+/Q3+ or I3−/Q3− after the quadrant transformation. After selecting the initial phase through the quadrant transformation in combination with a phase shifting of 0-90° realized by the amplitude attenuation, the phase shifting in a range of 0-360° is realized. After the first differential signals I1+ and I1− input to the first signal channel 120 and the second differential signals Q1+ and Q1− input to the second signal channel 130 are processed as described above, first phase shift signals I3+ and I3−, and second phase shift signals Q3+ and Q3− are obtained after phase-shifting.

Figure 12:
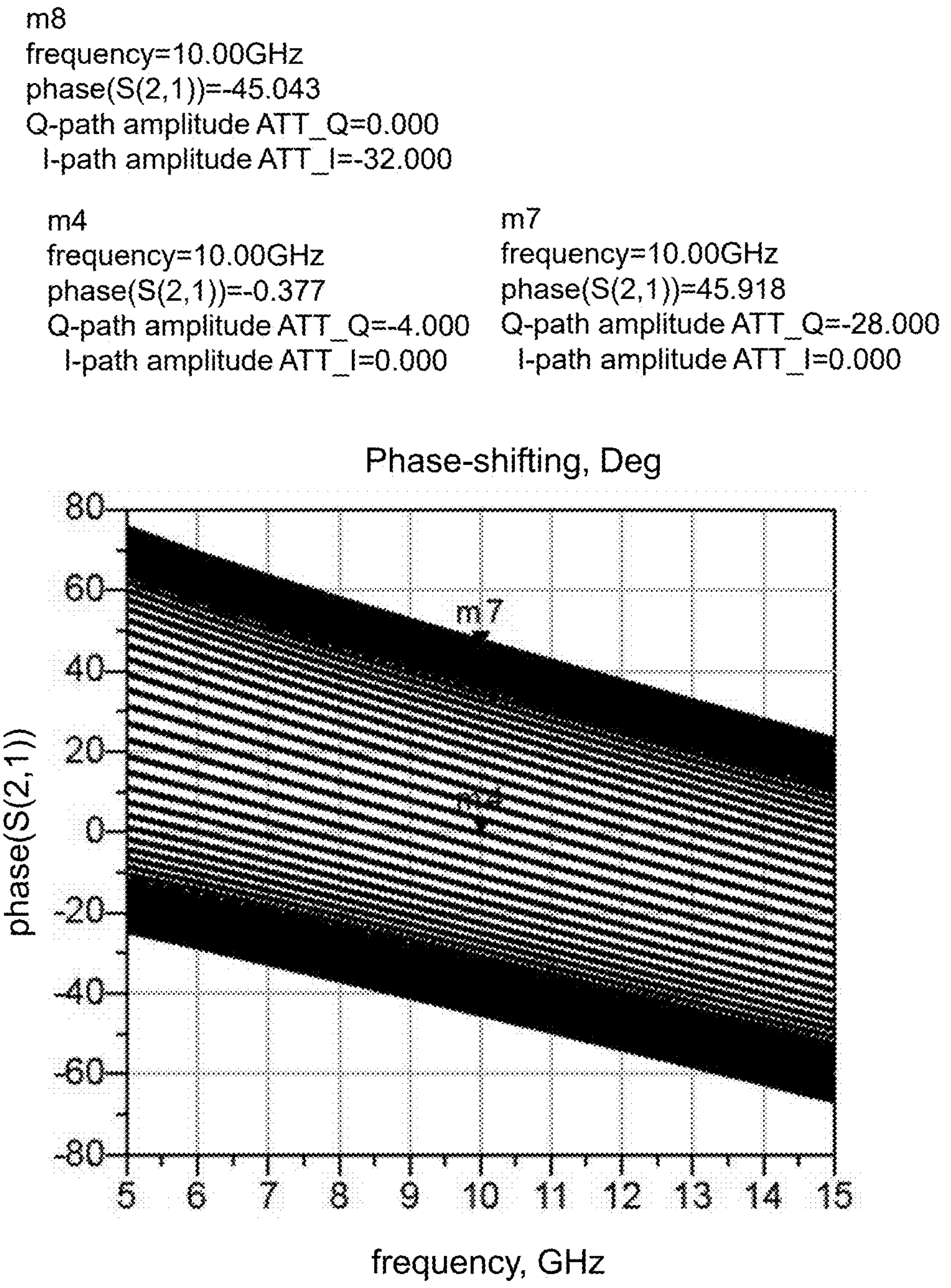
FIG. 12 is an exemplary schematic diagram illustrating a phase distribution of a first quadrant according to some embodiments of the present disclosure.

FIG. 12 is an exemplary schematic diagram illustrating a phase distribution of a first quadrant according to some embodiments of the present disclosure. Referring to phase simulation results in a first quadrant provided by the present disclosure shown in FIG. 12. As shown in FIG. 12, a signal attenuation circuit (5-bit step attenuation) disclosed in the present disclosure implements a phase shifting function in a range of 45 deg to −45 deg. The phase shifting function in a range of 0 deg to 90 deg may be realized by using a phase weighting, and the circuit structure may be directly applied to real scenarios. The specific attenuation values of the attenuator unit for 5-bit step attenuation are 1 dB, 2 dB, 4 dB, 8 dB, and 16 dB, respectively, which realize an attenuation range from 1 dB to 31 dB, with an attenuation step of 1 dB, thereby realizing a function of a phase minimum step 5.6 deg. If a smaller attenuation step is used, such as a 7-bit step attenuation (adding 0.5 dB and 0.25 dB), the attenuation range is 0.25 dB-31.75 dB, and the function of the phase minimum step 2.8 deg may be realized.

Figure 13:
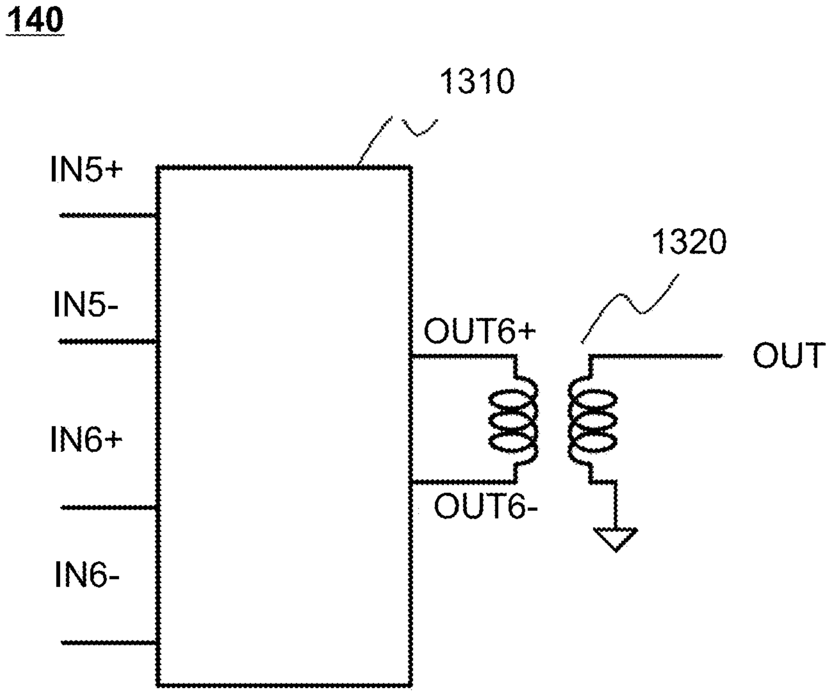
FIG. 13 is an exemplary structural diagram illustrating a second node circuit according to some embodiments of the present disclosure.

FIG. 13 is an exemplary structural diagram illustrating a second node circuit according to some embodiments of the present disclosure.

In some embodiments of the present disclosure, the second node circuit 140 includes a third differential circuit for implementing a vector synthesis. The third differential circuit includes a plurality of third input ends and at least one third output end. The third input ends of the third differential circuit receive a first phase shift signal (e.g., the first phase shift signals I3+ and I3−) and a second phase shift signal (e.g., the second phase shift signals Q3+ and Q3−), respectively, and the third output end outputs a synthesized signal obtained by signal synthesis. The synthesized signal refers to a pair of differential signals designated as the output signal. The third differential circuit may be used to construct a synthesizer. In some embodiments of the present disclosure, the second node circuit 140 also includes a third transformer. The third transformer is electrically connected to a third output port of the third differential circuit for transforming the pair of differential signals to a single-ended signal as the output signal. Exemplarily, the second node circuit 140 includes a synthesizer and a third transformer.

FIG. 13 illustrates the second node circuit 140 provided in the present disclosure, which is used to perform vector synthesis on the input first phase shift signals I3+ and I3−, and the second phase shift signals Q3+ and Q3−. The second node circuit 140 may include a synthesizer 1310 constructed based on the third differential circuit. The synthesizer 1310 includes two third input ends, one third input end is composed of the interfaces IN5+ and interface IN5−, and the other third input end is composed of the interfaces IN6+ and IN6−. One third input end is used for receiving the first phase shift signals I3+ and I3−, and the other third input end is used for receiving the second phase shift signals Q3+ and Q3−. That is, the first phase shift signals I3+ and I3− are input from the interface IN5+ and the interface IN5−, and the second phase shift signals Q3+ and Q3− are input from the interface IN6+ and the interface IN6−. The synthesizer 1310 performs the vector synthesis on the input signals and outputs a pair of synthesized differential signals from the third output end (composed of the interfaces OUT6+ and OUT6−), which is referred to as the synthesized signal in the present disclosure. If the phase-shifting circuit 100 is applied in a differential system (e.g., performing differential operation on the input signals), the synthesized signal may be designated as the output signal after phase-shifting. In some embodiments of the present disclosure, the second node circuit 140 also includes a third transformer 1320. The third transformer 1320 may be electrically connected to the third output ends of the synthesizer 1310 to transform the synthesized differential signal into a single-ended signal to be output from a single-ended output port OUT. This single-ended signal may be designated as the output signal after phase shifting.

Figure 14:
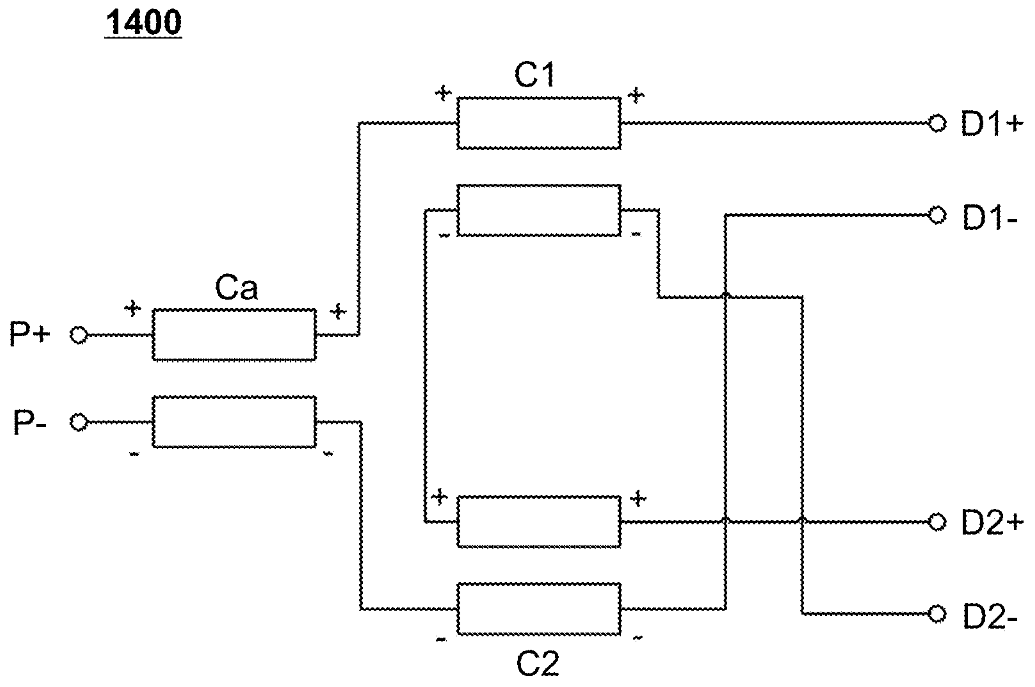
FIG. 14 is an exemplary structural diagram illustrating another differential circuit according to some embodiments of the present disclosure.

FIG. 14 an exemplary structural diagram illustrating another differential circuit according to some embodiments of the present disclosure.

In some embodiments of the present disclosure, as shown in FIG. 14, the third differential circuit 1400 includes an input differential network, an input differential unit, an output differential unit, and an output differential network. The input differential network may include an input port including a first port P+ and a second port P−. The input differential unit may include an input differential coupling line Ca. A positive electrode of an input end of the input differential coupling line Ca is connected to the first port P+, and a negative electrode of the input end of the input differential coupling line Ca is connected to the second port P−. The output differential unit may include a first coupling line C1 and a second coupling line C2. A positive electrode of an input end of the first coupling line C1 is connected to a positive electrode of an output end of the input differential coupling line Ca, and a negative electrode of an input end of the second coupling line C2 is connected to a negative electrode of the output end of the input differential coupling line Ca. At the same time, a negative electrode of the input end of the first coupling line C1 is connected to a positive electrode of the input end of the second coupling line C2. The output differential network may include a first output differential port and a second output differential port. A positive electrode interface D1+ of the first output differential port is connected to a positive electrode of an output end of the first coupling line C1, and a negative electrode interface D1− of the first output differential port is connected to a negative electrode of an output end of the second coupling line C2. A positive electrode interface D2+ of the second output differential port is connected to a positive electrode of the output end of the second coupling line C2, and a negative electrode interface D2− of the second output differential port is connected to a negative electrode of the output end of the first coupling line C1. The first output differential port and the second output differential port of the output differential network are used to receive a first phase shift signal (e.g., the first phase shift signals I3+ and I3−) and a second phase shift signal (e.g., the second phase shift signals Q3+ and Q3−), respectively, and the input differential network is used to output a synthesized signal.

In some embodiments of the present disclosure, the third differential circuit 1400 provided by the present disclosure as shown in FIG. 14 is used as the synthesizer 1310. The first output differential port D1+/D1− of the third differential circuit 1400 may be used as one third input end IN5+/IN5− of the synthesizer 1310, and the second output differential port D2+/D2− may be used for another third input end IN6+/IN6− of the synthesizer 1310. The input differential network P+/P− of the third differential circuit 1400 may be used for the third output port OUT6+/OUT6− of the synthesizer 1310. The first phase shift signals I3+ and I3− are input from the first output differential port D1+/D1−, and the second phase shift signals Q3+ and Q3− are input from the second output differential port D2+/D2−. The third differential circuit 1400 may implement a vector synthesis function, and output a pair of synthesized differential signals from the input differential network P+/P−.

The present disclosure discloses the synthesizer 1310 constructed utilizing the third differential circuit 1400, which enables a differential/synthesizer function capable of adjusting an electrical length of the coupling line, an odd mode impedance, and an even mode impedance to modulate an isolation degree, a wideband feature, an insertion loss, and a return loss. The third differential circuit 1400 is designed utilizing the differential coupling line. Since the electrical length of the coupling line is adjustable, a ¼ wavelength far less than a center frequency can be achieved by adjusting the electrical length of the coupling line. Thus, a small size, a reduced insertion loss, and an improved isolation degree can be achieved. The use of differential coupling lines in the third differential circuit 1400 also provides a high immunity to an interference and a high suppression of spurious and noise.

Figure 15:
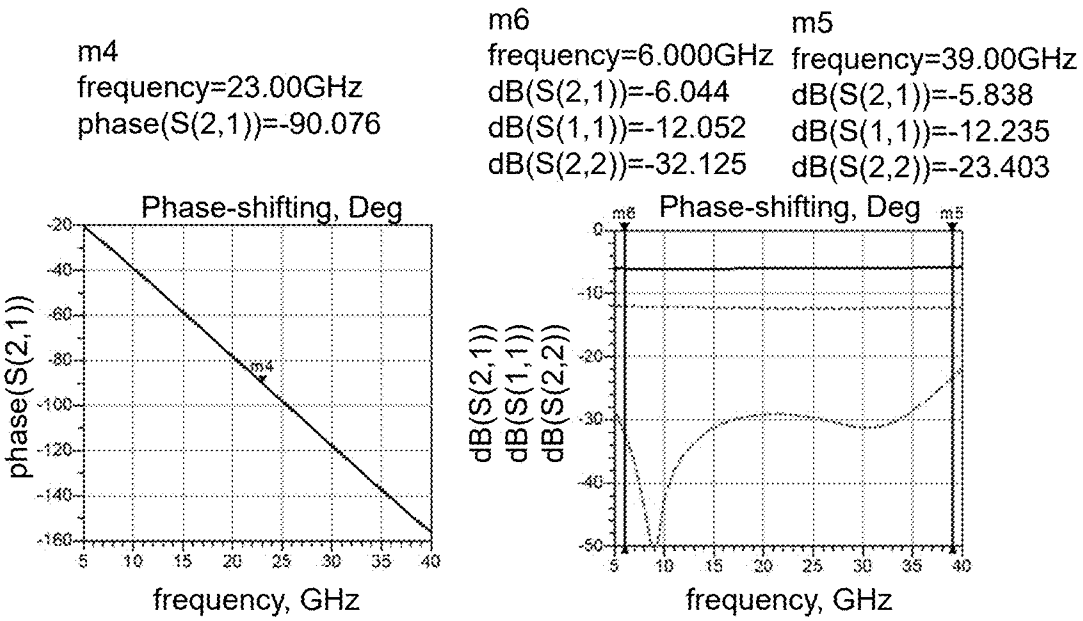
FIG. 15 is an exemplary schematic diagram illustrating an S-parameter and a phase of a phase-shifting circuit in a connected state according to some embodiments of the present disclosure.

The phase-shifting circuit using a differential circuit architecture in the present disclosure may be used to form a phase shifter, which realizes a three octave bandwidth. Referring to an S-parameter and a phase simulation result of a phase-shifting circuit provided in the present disclosure as shown in FIG. 15, a phase shifter function with an eight octave bandwidth is achieved within a frequency band of 5 GHz to 40 GHz.

Figure 16:
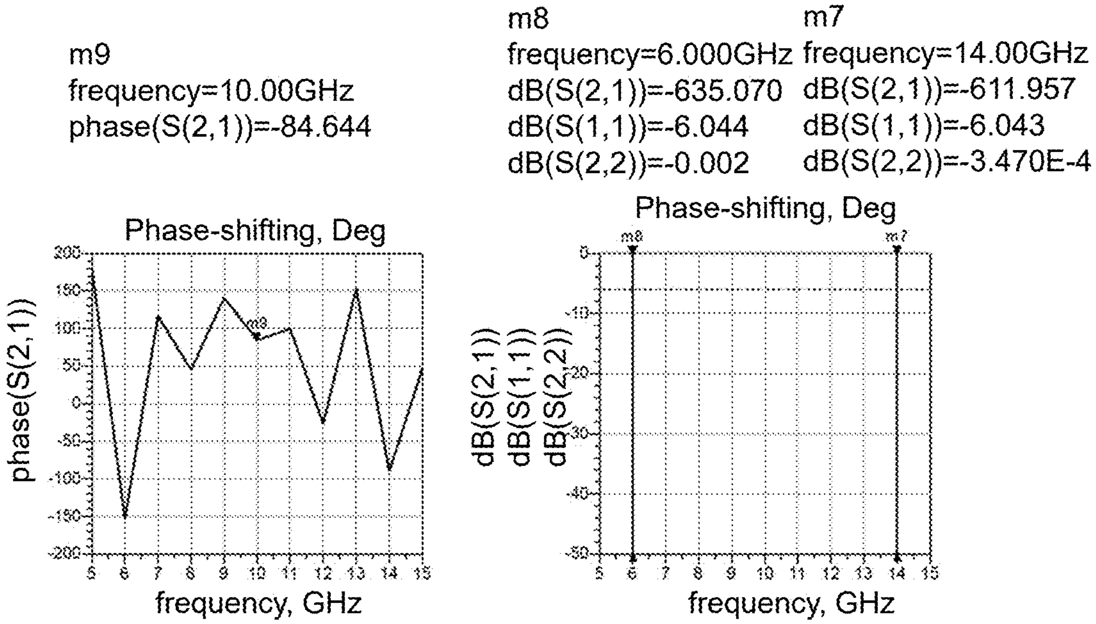
FIG. 16 is an exemplary schematic diagram illustrating an S-parameter and a phase of a phase-shifting circuit in a disconnected state according to some embodiments of the present disclosure.

The phase shifter, as one of important devices in a phased array application, needs to consider an operation situation under multi-path. Typically, when a channel is operating, and another channels are not operating, a performance of the phase shifter in the disconnected state needs to be considered. Referring to an exemplary schematic diagram illustrating an S-parameter and a phase performance of a phase-shifting circuit in a disconnected state provided by the present disclosure shown in FIG. 16, the phase shifter does not have a phase continuity (i.e., no phase characteristic) in the disconnected state, and at this time the phase shifter has a great attenuation value, thereby realizing a disconnection function of a phase shifter. A circuit structure of the phase shifter in the disconnected state may be as shown in FIG. 8(*c*), and the second differential circuit 700 is in an open state.

The phase-shifting circuit implemented using a differential circuit architecture disclosed in the present disclosure is capable of realizing a miniaturization and improving an anti-interference capability. At the same time, combining the differential circuit characteristic, an ultra-wideband feature is enabled. By using a passive vector synthesis modulation technique, a stable performance at the ultra-wideband frequency is achieved, including a stable phase characteristic, a stable insertion degree, and a stable return loss characteristic. A high-precision phase-shifting function may be realized through a high-precision signal amplitude attenuation, the attenuator has a band feature and features such as high-precision, which makes it extremely easy to realize the phase-shifting circuit. Additionally, a quadrant selection enables an output of any phase in a range of 0-360°, the process is achieved by simply switching a connection/disconnection state of the differential circuit, and the insertion loss may not be increased due to a phase increase. And by utilizing the synthesizer with the high isolation degree and high bandwidth to perform the vector synthesis, since the synthesizer has a high phase precision, a phase-shifting circuit with a high phase shifting precision is achieved. The phase-shifting circuit disclosed in the present disclosure may also be applied to the single-ended interface as well as the differential interface, resulting in a high degree of application flexibility.

Figure 17:
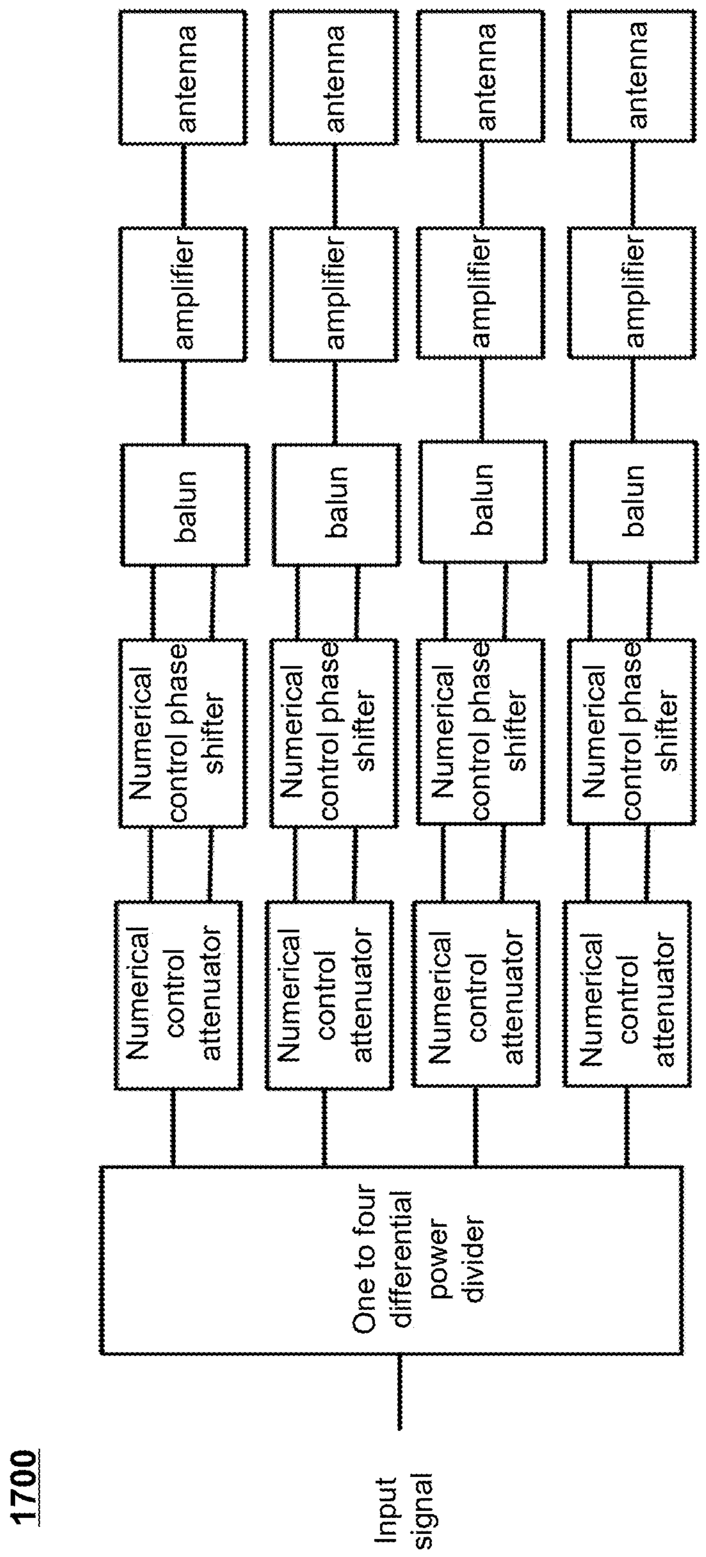
FIG. 17 is an exemplary structural diagram illustrating a radio frequency microwave emission system according to some embodiments of the present disclosure.

The present disclosure also discloses a radio frequency microwave emission system. The radio frequency microwave emission system may include the phase-shifting circuit as described above such as a numerical control phase shifter constructed from the phase-shifting circuit. Referring to an exemplary structural diagram illustrating a radio frequency microwave emission system provided in the present disclosure as illustrated in FIG. 17, the radio frequency microwave emission system 1700 may include a one to four differential power divider for transforming the input signal taken as the differential signal into four-path differential signals of equal amplitude and the same phase. Input ends of four numerical control attenuators are respectively connected to the four output differential ports of the one to four differential power divider, and the four numerical control attenuators are used for attenuating the four-path differential signals output from the one to four differential power divider. Input ends of four numerical control phase shifters are respectively connected to the output ends of the four numerical control attenuators, and the four numerical control phase shifters are used to perform a phase shifting processing for the four-path differential signals output from the four numerical control attenuators. The numerical control phase shifter may be constructed based on the phase-shifting circuit described above in the present disclosure. Differential ports of four baluns are respectively connected to the output ends of the four numerical control phase shifters, and the four baluns are used to transform the four-path differential signals output from the four numerical control phase shifters into four-path single-ended signals. The input ends of four amplifiers are respectively connected to matching ports of the four baluns, and the four amplifiers are used to amplify the four-path single-ended signals output from the four baluns. Receiving ends of four antennas are respectively connected to the output ends of the four amplifiers, and the four antennas are used for emitting the four-path single-ended signals output by the four amplifiers. The four-path radio frequency microwave emission system may be used in systems such as a multibeam power-division network, a 5G MIMO communication, an LOS communication, etc. It should be understood that FIG. 17 merely shows an example, and a count of the numerical control attenuators, the numerical control phase shifters, the baluns, the amplifiers, and the antennas included in the radio frequency microwave emission system may be the same as the count of the output differential ports of the differential power divider. For example, two devices described above can be provided when applying the one to two differential power divider, and eight devices described above can be provided when applying the one to eight differential power divider. One device described above can be provided when no differential operation is performed.

Figure 18:
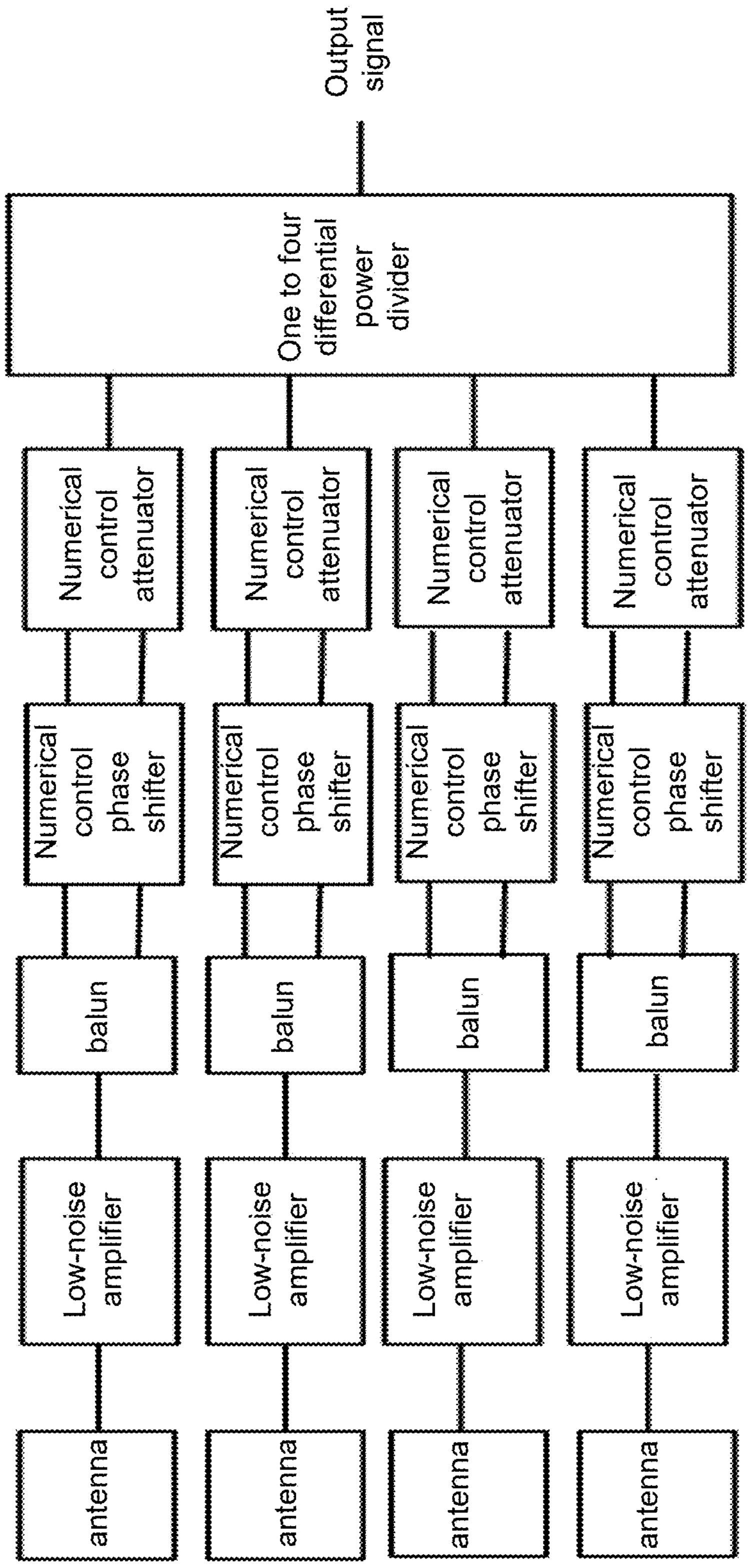
FIG. 18 is an exemplary structural diagram illustrating a radio frequency microwave receiving system according to some embodiments of the present disclosure.

The present disclosure also discloses a radio frequency microwave receiving system. The radio frequency microwave receiving system may include a phase-shifting circuit as described above, such as a numerical control phase shifter constructed from the phase-shifting circuit. Referring to an exemplary structural diagram illustrating a radio frequency microwave receiving system provided in the present disclosure shown in FIG. 18, the radio frequency microwave receiving system 1800 may include four antennas for receiving four-path single-ended signals. Input ends of four low-noise amplifiers are respectively connected to the four antennas, and the four low-noise amplifiers are used to amplify the four-path single-ended signals received by the four antennas. The matching ports of four baluns are respectively connected to the output ends of the four low-noise amplifiers, and the four baluns are used to transform the four-path single-ended signals output from the four low-noise amplifiers into four-path differential signals. Input ends of the four numerical control phase shifters are respectively connected to the differential ports of the four baluns, and the four numerical control phase shifters are used to perform phase shifting on the four-path differential signals output from the four baluns. Input ends of the four numerical control attenuators are respectively connected to the output ends of the four numerical control phase shifters, and the four numerical control attenuators are used to perform attenuation processing on the four-path differential signals output by the four numerical control phase shifters. Four output differential ports of the one to four differential power divider are respectively connected to the output ends of the four numerical control attenuators, and the one to four differential power divider is used to transform the four-path differential signals output from the four numerical control attenuators into one-path differential signal. The four-path radio frequency microwave receiving system may be used in systems such as a multi-beam power division network, the 5G MIMO communication, the LOS communication, etc. Similarly, FIG. 18 merely shows an example, and the count of numerical control attenuators, numerical control phase shifters, baluns, amplifiers, and antennas included in the radio frequency microwave receiving system may be the same as the count of output differential ports of the differential power divider. For example, two devices described above can be provided when applying a one to two differential power divider, and eight devices described above can be provided when applying a one to eight differential power divider. And one device described above can be provided when no differential and synthesis operation is performed.

The basic concepts have been described in the present disclosure, and it will be apparent to those skilled in the art that the foregoing detailed disclosure serves only as an example and does not constitute a limitation of the present disclosure. Although not explicitly stated here, those skilled in the art may make various modifications, improvements and amendments to the present disclosure. These modifications, improvements, and amendments are intended to be suggested by the present disclosure, and are within the spirit and scope of the exemplary embodiments of the present disclosure.

Moreover, certain terminology has been used to describe embodiments of the present disclosure. As in "an embodiment," "one embodiment," or "some embodiments" means a feature, structure, or characteristic associated with at least one embodiment of the present disclosure. Accordingly, it should be emphasized and noted that "an embodiment" or "one embodiment" referred to two or more times in different positions in the present disclosure do not necessarily refer to the same embodiment. In addition, some features, structures, or characteristics in one or more embodiments of the present disclosure may be appropriately combined.

Similarly, it should be noted that to simplify the presentation of the disclosure of the present disclosure, and thus to aid in the understanding of one or more embodiments of the present disclosure, the foregoing descriptions of embodiments of the present disclosure sometimes combine a variety of features into a single embodiment or description thereof. However, the present disclosure does not mean that the object requires more features than the features mentioned in the claims. Rather, claimed subject matter may lie in less than all features of a single foregoing disclosed embodiment.

At last, it should be understood that the embodiments described in the present disclosure are merely illustrative of the principles of the embodiments of the present disclosure. Other modifications employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to the embodiments precisely shown and described.

What is claimed is:

1. A phase-shifting circuit, comprising:

a first node circuit;

a second node circuit; and a first signal channel and a second signal channel coupled between the first node circuit and the second node circuit, wherein the first node circuit is configured to split an input signal to simultaneously output a first differential signal to the first signal channel, and output a second differential signal to the second signal channel;

the first signal channel and the second signal channel are implemented based on an architecture of a differential circuit, and the first signal channel and the second signal channel are configured to perform at least one of a signal attenuation and a quadrant transformation on the first differential signal and the second differential signal for phase-shifting, respectively; and the second node circuit is configured to synthesize a first phase shift signal output by the first signal channel and a second phase shift signal output by the second signal channel to obtain an output signal, a phase difference between the output signal and the input signal being within a range of 0 deg-360 deg.

2. The phase-shifting circuit of claim 1, wherein the first node circuit includes:

a signal processor, and a first transformer and a second transformer electrically connected to two output ends of the signal processor, respectively; wherein the signal processor is configured to generate a pair of orthogonal signals based on the input signal, and the orthogonal signals are input from the two output ends to the first transformer and the second transformer, respectively; and the first transformer and the second transformer are configured to generate the first differential signal and the second differential signal based on the orthogonal signals.

3. The phase-shifting circuit of claim 2, wherein the first signal channel and the second signal channel are connected to the first transformer and the second transformer, respectively, both of the first signal channel and the second signal channel include a signal attenuation circuit, each attenuation circuit includes a plurality of first differential circuits electrically connected in sequence, and the electrical connection between two adjacent first differential circuits includes a direct connection or a connection through an attenuator unit to realize a phase shift in a range of 0 deg-90 deg by attenuating an amplitude of the first differential signal or the second differential signal.

4. The phase-shifting circuit of claim 3, wherein the plurality of first differential circuits are the same.

5. The phase-shifting circuit of claim 3, wherein at least one of the plurality of first differential circuits selects the electrical connection to an adjacent first differential circuit through connection or disconnection between a positive and negative electrode interface of a first input end and a positive and negative electrode interface of a first output end.

6. The phase-shifting circuit of claim 3, wherein both of the first signal channel and the second signal channel further include a quadrant transformer circuit electrically connected to the signal attenuation circuit;

the quadrant transformation circuit includes a second differential circuit for realizing the quadrant transformation through connection or disconnection between a positive and negative electrode interface of a second input end and a positive and negative electrode interface of a second output end to change an initial phase of at least one of the first differential signal and the second differential signal after the phase shifting.

7. The phase-shifting circuit of claim 1, wherein the second node circuit includes a third differential circuit for realizing a vector synthesis, a third input end of the third differential circuit receives the first phase shift signal and the second phase shift signal, respectively, and a third output end of the third differential circuit outputs a synthesized signal obtained after a signal synthesis.

8. The phase-shifting circuit of claim 7, wherein the third differential circuit includes:

an input differential network including a first port and a second port;

an input differential unit including an input differential coupling line;

an output differential unit including a first coupling line and a second coupling line; and an output differential network including a first output differential port and a second output differential port; wherein a positive electrode of an input end of the input differential coupling line is connected to the first port, and a negative electrode of the input end of the input differential coupling line is connected to the second port;

a positive electrode of an input end of the first coupling line is connected to a positive electrode of an output end of the input differential coupling line, and a negative electrode of an input end of the second coupling line is connected to a negative electrode of the output end of the input differential coupling line;

a negative electrode of the input end of the first coupling line is connected to a positive electrode of the input end of the second coupling line;

a positive electrode interface of the first output differential port is connected to a positive electrode of an output end of the first coupling line, and a negative electrode interface of the first output differential port is connected to a negative electrode of an output end of the second coupling line;

a positive electrode interface of the second output differential port is connected to a negative electrode of the output end of the second coupling line, and a negative electrode interface of the second output differential port is connected to a negative electrode of the output end of the first coupling line; and the first output differential port and the second output differential port of the output differential network are configured to receive the first phase shift signal and the second phase shift signal, respectively, and the input differential network is configured to output the synthesized signal.

9. The phase-shifting circuit of claim 7, wherein the synthesized signal is a pair of differential signals designated as the output signal; or the second node circuit further includes a third transformer;

the third transformer is electrically connected to the third output end of the third differential circuit, and the third transformer is configured to transform the pair of differential signals to a single-ended signal as the output signal.

10. A radio frequency microwave system comprising a phase-shifting circuit of claim 1.

* * * * *